(12) United States Patent
Yamamoto

(10) Patent No.: US 8,906,253 B2
(45) Date of Patent: Dec. 9, 2014

(54) GAP EMBEDDING COMPOSITION, METHOD OF EMBEDDING GAP AND METHOD OF PRODUCING SEMICONDUCTOR DEVICE BY USING THE COMPOSITION

(71) Applicant: FUJIFILM Corporation, Tokyo (JP)

(72) Inventor: Keiji Yamamoto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/906,027

(22) Filed: May 30, 2013

(65) Prior Publication Data
US 2013/0273741 A1 Oct. 17, 2013

Related U.S. Application Data

(63) Continuation of application No. PCT/JP2012/052566, filed on Jan. 30, 2012.

(30) Foreign Application Priority Data

Feb. 17, 2011 (JP) .................................. 2011-032121

(51) Int. Cl.
*C09K 13/06* (2006.01)

(52) U.S. Cl.
USPC ......... 252/79.4; 252/79.1; 438/717; 438/725; 430/322

(58) Field of Classification Search
USPC .................. 252/79.1, 79.2, 88.2, 79.3, 79.4; 428/147, 282, 424, 588; 438/675, 719, 438/725, 694, 717; 430/322, 325
See application file for complete search history.

(56) References Cited

U.S. PATENT DOCUMENTS

| | | | |
|---|---|---|---|
| 2002/0110665 A1* | 8/2002 | Rutter et al. | 428/137 |
| 2002/0123206 A1* | 9/2002 | Hong et al. | 438/424 |
| 2010/0178620 A1* | 7/2010 | Dei et al. | 430/325 |

FOREIGN PATENT DOCUMENTS

| | | |
|---|---|---|
| JP | 2008-287176 A | 11/2008 |
| JP | 2010-032996 A | 2/2010 |
| JP | 2010-286618 A | 12/2010 |
| JP | 2011-27980 A | 2/2011 |
| WO | 2009/054413 A1 | 4/2009 |
| WO | 2010/010928 A1 | 1/2010 |
| WO | 2011/011139 A2 | 1/2011 |

OTHER PUBLICATIONS

Yasushi Sakaida et al, "Development of reverse materials for Double patterning process", Proc. of SPIE, pp. 76391Z-1 to 9, vol. 7639, Apr. 17, 2010.
International Search Report of PCT/JP2012/052566 dated Apr. 3, 2012.
Office Action dated Oct. 21, 2014 for corresponding Japanese Patent Application No. 2012-032100.

* cited by examiner

*Primary Examiner* — Lan Vinh
(74) *Attorney, Agent, or Firm* — Sughrue Mion, PLLC

(57) ABSTRACT

A gap embedding composition used for embedding a patterned gap formed between photosensitive resin film portions on a semiconductor substrate surface, the gap embedding composition, at least having: a hydrolysis condensate of an aryloxysilane raw material; and an aromatic compound, as a solvent.

9 Claims, 2 Drawing Sheets

GAP EMBEDDING COMPOSITION, METHOD OF EMBEDDING GAP AND METHOD OF PRODUCING SEMICONDUCTOR DEVICE BY USING THE COMPOSITION

CROSS-REFERENCE TO RELATED APPLICATIONS

This application is a continuation of International Application No. PCT/JP2012/052566 filed Jan. 30, 2012 and which claims priority from Japanese Patent Application No. 2011-032121 filed Feb. 17, 2011, the above applications incorporated herein by reference in their entirety.

TECHNICAL FIELD

The present invention relates to a composition for use in embedding a gap (hereinafter referred to as "a gap embedding composition"), which may be used for manufacturing a semiconductor substrate or the like, a method of embedding a gap and a method of producing a semiconductor device by using the composition.

BACKGROUND ART

Both miniaturization and densification of a semiconductor device structure are a continuing and insatiable proposition in this industrial field. Recently, a development race of the semiconductor device structure is particularly growing intense. As a result, challenging efforts aimed at improving the performance by virtue of high-degree integration of the device: in other words, both increase in operation speed and reduction in power consumption are progressing at an accelerated pace. It is not an exaggeration to say that feasibility of the high-degree integration is left to development of production engineering of the device. Accordingly, research and development of new production methods and new production materials are enthusiastically made in countries including developing countries and in varied companies.

Photolithography is widely used for manufacture of the semiconductor substrate. According to this method, a predetermined manufacturing is completed through processes of: putting wire mask (photomask) on top of the base substrate having a photosensitive resin (resist) coated thereon; and then exposing, developing, etching, removing of the resist and the like. With progression of high-degree integration and miniaturization of the device, the gap width of a mask pattern for wire manufacturing is becoming extremely narrow to the tens of nanometer level. It has been difficult to realize a manufacturing of high precision only by simply patterning a photoresist mask and then etching the patterned gap.

In view of the above points, a method of manufacturing a semiconductor that is called "a double patterning technique" is proposed in recent days (refer to Non-Patent Literature 1). The procedure of manufacturing in this technique is schematically shown in FIG. 1. In this case, firstly a workpiece material film 2 is formed on a silicon wafer 3 and then a photosensitive resin pattern (PR pattern) 1 is formed on the workpiece material film (FIG. 1(a)). Next, a reverse material is applied from the upper side of the photosensitive resin pattern 1 to form a reverse material film 4 (FIG. 1(b)). In this time, the reverse material is embedded between gap h of the photosensitive resin pattern (photosensitive resin film portions) 1. The gap h may be either a hole or a trench. Further, a surface of the reverse material film 4 is subjected to Etch back to form a planarized reverse material film (reverse material pattern) 41, thereby exposing the photosensitive resin pattern 1 (FIG. 1(c)). Then, the photosensitive resin pattern 1 is removed to create a form in which a gap k is produced in the reverse material pattern (FIG. 1(d)). Etching is conducted using the reverse material pattern 41 as a resist to form a trench or hole k' corresponding to the gap k in the workpiece material film 2, whereby a manufactured film 21 having been produced to have a desired form (FIG. 1(e)). As for the reverse material, the Non-Patent Literature 1 proposes to use a liquid in which a Si material is contained in a methylisobutyl-carbinol (MIBC) solvent.

Further, Patent Literature 1 discloses, as an example, use of a hydrolysis condensate whose molecular weight has been adjusted to about 1,000 by subjecting alkoxysilane to hydrolysis in a solvent such as alcohol. In this case, the solvent used in the above-described hydrolysis is reused for dissolution of the hydrolysis condensate, and the resultant solution is used as a reverse resist material.

CITATION LIST

Patent Literatures

Patent Literature 1: JP-A-2008-287176 ("JP-A" means unexamined published Japanese patent application)

Non-Patent Literatures

Non-Patent Literature 1: Yasushi Sakaida et al., "Development of reverse materials for Double patterning process" Proc. Of SPIE, Vol. 7639, pp. 76391Z-1 to 9

DISCLOSURE OF INVENTION

Technical Problem

The present inventors have investigated embedding compositions that are composed of components different from those disclosed in the non-patent literature and the patent literature described above. Through this investigation, it is expected that the kind of materials for the embedding composition will be enriched thereby addressing the needs of diversity of applicable types and conditions, and in addition thereto a particular effect due to a novel material will be exhibited.

In view of the above, the present invention addresses to the provision of a composition especially suitable as a reverse material that is applied to a patterning technique for the semiconductor substrate. Specifically, the present invention addresses to the provision of a gap embedding composition, which is composed of a novel component composition, has a good embedding property for the gap formed in the photosensitive resin pattern (photosensitive resin portions), and has excellent coating property and planarization, and by which damage to the photosensitive resin pattern is suppressed and also high ashing selectivity for this matter is realized. Further, the present invention addresses to the provision of a composition that exhibits especially high effects with respect to the above items when combined with the photosensitive resin for EUV exposure. Further, the present invention addresses to the provision of a method of embedding a gap and a method of producing a semiconductor device, both of which utilize the above-described composition.

Solution to Problem

According to the present invention, there is provided the following means:

(1) A gap embedding composition used for embedding a patterned gap formed between photosensitive resin film portions on a semiconductor substrate surface, the gap embedding composition, at least comprising:

a hydrolysis condensate of an aryloxysilane raw material; and an aromatic compound, as a solvent.

(2) The composition described in (1), wherein the solvent is a compound selected from mesitylene, cumene, xylene, toluenene, and benzene.

(3) The composition described in (1) or (2), wherein the hydrolysis condensate is poly(phenylsiloxane) (PPSQ).

(4) The composition described in any one of (1) to (3), wherein the hydrolysis condensate has an average molecular weight of 1,000 to 50,000.

(5) The composition described in any one of (1) to (4), wherein a solvent for dissolving the aryloxysilane raw material used for the above-described hydrolysis and condensation is different from the solvent for incorporating the hydrolysis condensate therein.

(6) The composition described in any one of (1) to (5), for use in a patterning technique comprising: removing the patterned photosensitive resin film portions; and subjecting a semiconductor substrate to etching manufacturing by using, as a resist, a cured film of the hydrolysis condensate having been left in the gap portion.

(7) The composition described in (6), wherein a width of the patterned gap between the photosensitive resin film portions is 32 nm or less, and an aspect ratio (depth/width) of the gap is 1.5 or more.

(8) The composition described in (6) or (7), wherein the photosensitive resin is sensitive to EUV exposure.

(9) A method of embedding a gap, comprising the steps of:

preparing a patterned gap formed between photosensitive resin film portions on a semiconductor substrate surface; and dispensing the composition described in any one of (1) to (8) to the patterned gap so as to embed the patterned gap with the composition.

(10) A method of producing a semiconductor device, comprising the steps of:

preparing a patterned gap formed between photosensitive resin film portions on a semiconductor substrate surface;

dispensing the composition described in any one of (1) to (9) to the patterned gap so as to embed the patterned gap with the composition;

curing the composition containing the hydrolysis condensate;

removing the photosensitive resin film portions; and then etching the semiconductor substrate other than the portion of cured composition having been left in the former patterned gap.

(11) The method of producing a semiconductor device described in (10), comprising the step of heating and curing the photosensitive resin film portions before dispensing the embedding composition to the patterned gap.

(12) The method described in (11), wherein the photosensitive resin is sensitive to EUV exposure.

Advantageous Effects of Invention

The composition of the present invention provides a performance especially suitable for a reverse material that is applied to a patterning technique for the semiconductor substrate. Specifically, the composition of the present invention, is composed of a novel component composition, exhibits a good embedding property for the gap formed in the photosensitive resin pattern (photosensitive resin film portions), and further has excellent coating property and planarization. Further, by the composition, damage to the photosensitive resin pattern can be suppressed and also high ashing selectivity for a workpiece material can be realized. Further, the composition of the present invention exhibits especially high effects, with respect to the above-mentioned items, when combined with the photosensitive resin that is sensitive to EUV exposure. Further, by virtue of the above-mentioned advantages, the gap embedding method and the method of producing a semiconductor device each utilizing the composition of the present invention each make it possible to enhance both the productivity and the manufacturing quality of production of a semiconductor device that requires microfabrication.

Other and further features and advantages of the invention will appear more fully from the following description, appropriately referring to the accompanying drawing.

MODE FOR CARRYING OUT THE INVENTION

Figure 1:
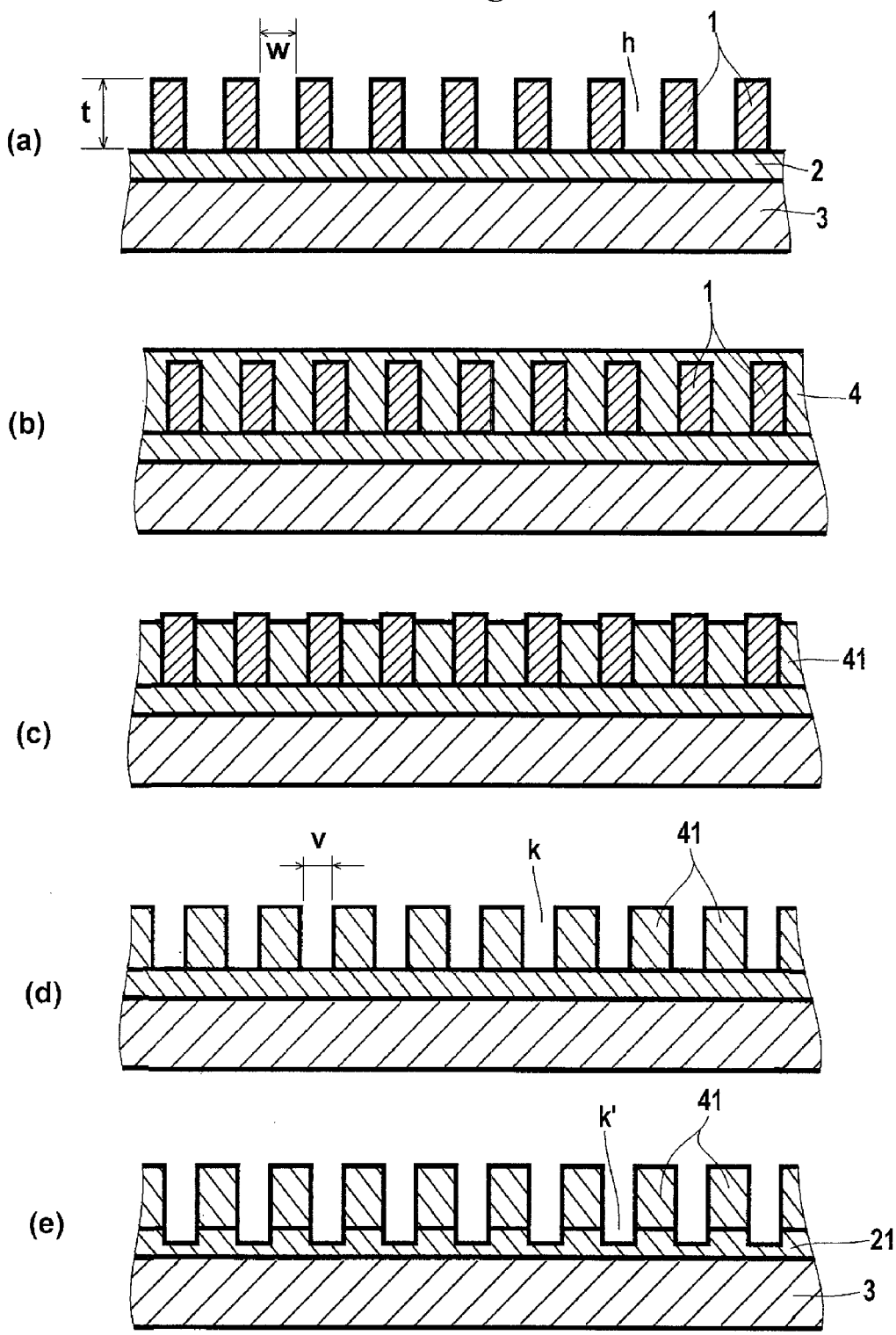
FIG. 1 is an example of an illustration diagram of processes that schematically illustrates a patterning technique of a semiconductor substrate with reference to a cross-sectional view of the semiconductor substrate.

The gap embedding composition of the present invention includes (a) a hydrolysis condensate of, at least, an alkoxysilane raw material and (b) an aromatic compound as a solvent. By the gap embedding composition, the kind of an embedding composition useful for a semiconductor manufacturing may be enriched, and in addition thereto when the embedding composition is used as a composition for embedding a patterned gap composed of a photosensitive resin and formed on a semiconductor substrate surface, good properties especially suitable for the semiconductor manufacturing may be exhibited. Hereinafter, the preferable embodiment of the present invention is described.

<Gap Embedding Composition>

The gap embedding composition of the present invention can be favorably used for embedding by coating onto the patterned gap formed between the photosensitive resin film portions on the semiconductor substrate surface. Neither of shape nor size of the gap is limited in particular. The gap may be in either form of hole or trench. Regarding the dimension of the patterned gap formed between the photosensitive resin film portions, the gap width is preferably 32 nm or less, and more preferably 22 nm or less, in consideration of addressing the miniaturization of manufacturing of the semiconductor substrate. Though the lower limit of the gap width is not limited in particular, it is practical that the lower limit is 10 nm or more. In the present specification, the gap width of the patterned gap formed between the photosensitive resin film portions indicates w shown in FIG. 1, and refers to the width of space in the cross-section of either hole or trench. In the case where the width is not constant in the depth direction, an average value of the width is used. The aspect ratio (depth/width) of the gap is preferably 1.5 or more, and more preferably 2.0 or more. Although the upper limit of the aspect ratio is not particularly limited, it is practically 10 or less, more practically 6 or less. The aspect ratio is preferably 6 or less. The depth for calculation of the aspect ratio is defined by t shown in FIG. 1. Usually, the depth has the same definition as the film thickness of the photosensitive resin pattern. The width has the same meaning as that of the above-described gap width w.

The gap width v of the gap k formed in the patterned reverse material (reverse material pattern) after having removed the photosensitive resin pattern is not limited in particular. In consideration of the miniaturization as described above, the gap width k of the reverse material pattern 41 is preferably 32 nm or less, and more preferably 22 nm or less. Though the lower limit of the gap width is not limited in particular, it is practical that the lower limit is 10 nm or more. The definition of the width herein used is the same as that of the gap width w.

The ratio of ashing rate (ashing rate of photosensitive resin/ashing rate of reverse material) when the photosensitive resin pattern is removed while leaving the reverse material pattern is preferably 4 or more, and more preferably 6 or more. This ratio makes it possible to form a good shape of the reverse material pattern without a residue of the photosensitive resin. Though the upper limit of the ratio of ashing rate is not present in particular, it is usually 15 or less.

<Aryloxysilane Raw Material>
(Aryloxysilane)

In order to produce a hydrolysis condensate in the present invention, an aryloxysilane raw material is at least used as a starting raw material. In the present specification, the hydrolysis condensate of the aryloxysilane raw material may be the hydrolysis condensate of aryloxysilane, and also may be a composite condensate of alkylalkoxysilane or the like and the aryloxysilane.

The aryloxysilane is preferably an organic silicon compound in which one aryl group and three alkoxy groups are bonded to a silicon atom, and can be represented by the following Formula (A).

$$R^1Si(OR^2)_3 \qquad \text{Formula (A):}$$

($R^1$ represents an aryl group and $R^2$ represents an alkyl group.)

The aryl group ($R^1$ in Formula (A)) is not limited in particular. However, an aryl group having 6 to 14 carbon atoms is preferable, more preferably 6 to 10, from the viewpoints of excellent effects obtained by the invention and ease in availability of the aryloxysilane. Specific examples thereof are a phenyl group, a tolyl group, a mesityl group, a naphthyl group, an anthranil group, and a phenanthryl group. Among them, a phenyl group is most preferable.

The alkoxy group is not limited in particular. Examples of the alkoxy group include a methoxy group and an ethoxy group. More specifically, as $R^2$ in Formula (A), a straight chain or branched alkyl group having 1 to 20 carbon atoms is preferable. Especially, the number of carbon atoms is preferably from 1 to 10, and more preferably from 1 to 4 from the viewpoint of excellent effects obtained by the invention. In particular, an ethoxy group, in which $R^2$ in Formula (A) is an ethyl group, is preferable from the viewpoint of ease in control of hydrolysis rate.

Examples of the preferable aryloxysilane compound include phenyltrimethoxysilane and phenyltriethoxysilane. The aryltrialkoxysilane may be used as a component of either only one kind or in combination of two kinds or more.

Among the aryloxysilane raw materials, the content of aryloxysilane is preferably 50% by mass or more, and more preferably in a range from 75% by mass to 100% by mass, with respect to a total amount of the alkoxysilane. The content equal to or more than the above-described lower limit may provide an advantage in terms of coating properties and solubility with respect to a coating solvent.

(Other Alkoxysilane)

Other alkoxysilanes can be used in addition to the above-described aryloxysilane as an aryloxysilane raw material. Example thereof includes alkyltrialkoxysilane and tetraalkoxysilane.

The alkyltrialkoxysilane is an organic silicon compound in which one alkyl group and three alkoxy groups are bonded to a silicon atom, and can be represented by the following Formula (1).

$$R^{11}Si(OR^{12})_3 \qquad \text{Formula (1):}$$

($R^{11}$ and $R^{12}$ each independently represents an alkyl group.)

The alkyl group of the alkyltrialkoxysilane ($R^{11}$ in Formula (1)) is not limited in particular. However, a straight chain or branched alkyl group having 1 to 20 carbon atoms is preferable from the viewpoints of excellent effects obtained by the invention and ease in availability of the alkyltrialkoxysilane. Especially, the number of carbon atom is preferably from 1 to 10, and more preferably from 1 to 3 from the viewpoints of excellent effects obtained by the invention. Specifically, examples of the alkyl group include a methyl group, an ethyl group, a propyl group, and an isopropyl group. Further, the most preferable group of these groups is a methyl group.

The alkoxy group of the alkyltrialkoxysilane is not limited in particular. Examples of the alkoxy group include a methoxy group and an ethoxy group. More specifically, as $R^{12}$ in Formula (1), a straight chain or branched alkyl group having 1 to 20 carbon atoms is preferable. Especially, the number of carbon atom is preferably from 1 to 10, and more preferably from 1 to 4, from the viewpoint of excellent effects obtained by the invention. In particular, an ethoxy group, in which $R^{12}$ in Formula (1) is an ethyl group, is preferable, from the viewpoint of ease in control of hydrolysis rate.

The tetraalkoxysilane is an organic silicon compound in which four alkoxy groups are bonded to a silicon atom, and can be represented by the following Formula (2).

$$Si(OR^{23})_4 \qquad \text{Formula (2):}$$

($R^{23}$ each independently represents an alkyl group.)

The alkoxy group of the tetraalkoxysilane is not limited in particular. Examples of the alkoxy group include a methoxy group and an ethoxy group. More specifically, as $R^{23}$ in Formula (2), a straight chain or branched alkyl group having 1 to 20 carbon atoms is preferable. Especially, the number of carbon atom is preferably from 1 to 10, and more preferably from 1 to 4, from the viewpoint of excellent effects obtained by the invention. In particular, an ethoxy group, in which $R^{23}$ in Formula (2) is an ethyl group, is preferable, from the viewpoint of ease in control of hydrolysis rate.

Examples of the tetraalkoxysilane include tetramethoxysilane, tetraethoxysilane, tetra-n-propoxysilane, tetraisopropoxysilane, tetra-n-butoxysilane, tetra-isobutoxysilane, and tetra-tert-butoxysilane. Among them, tetramethoxysilane and tetraethoxysilane are favorably used.

The tetraalkoxysilane may be used as a component of either only one kind or in combination of two kinds or more.

The content of the alkyltrialkoxysilane in the aryloxysilane raw material is not limited in particular. However, from the viewpoints of coating properties and solubility with respect to a coating solvent, the content is preferably 50% by mass or less, and more preferably in a range from more than 0 to 25% by mass. Further, although the content of the tetraalkoxysilane is not limited in particular, the content is preferably 50% by mass or less, and more preferably in a range from more than 0 to 25% by mass, from the viewpoints of coating properties and solubility with respect to a coating solvent.

<Hydrolysis Condensate>

The hydrolysis condensate contained in the gap embedding composition of the present invention is a compound that is obtained through a hydrolysis reaction and a condensation reaction using the above-described aryloxysilane raw material. More specifically, the compound is referred to a compound produced by the process which includes: hydrolyzing a part of or all of alkoxy groups of the aryloxysilane and the like to convert from the alkoxy group to a silanol group; and at least partially condensing the thus-converted silanol group to form a Si—O—Si bond.

As for the hydrolysis reaction and the condensation reaction, known methods can be used. According to the necessity, a catalyst such as acid or base may be used. The catalyst is not limited in particular, as long as it enables to change a pH. Specifically, examples of the acid (organic acid or inorganic acid) include nitric acid, oxalic acid, acetic acid, and formic acid. Examples of alkali include ammonia, triethylamine, and ethylenediamine. The use amount of the catalyst is not limited in particular, as long as a hydrolysis condensate is produced so that the predetermined molecular weight thereof can be attained.

According to the necessity, a solvent may be added to a reaction system of the hydrolysis reaction and the condensation reaction. The solvent is not limited in particular, as long as the hydrolysis reaction and the condensation reaction can be conducted. Examples of the solvent include organic hydrocarbons [for example, benzene, toluene, xylene, or the like], halogenated hydrocarbons [for example, methylene chloride, chloroform, or the like], ethers [for example, tetrahydrofurane, diethylether, ethyleneglycol dimethylether, propyleneglycol monomethylether acetate, 1,4-dioxane, or the like], ketones [for example, acetone, methyl ethyl ketone, methyl isobutyl ketone, cyclohexanone, or the like], esters [for example, methyl acetate, ethyl acetate, butyl acetate, amyl acetate, or the like], alcohols [for example, methanol, ethanol, isopropyl alcohol, butyl alcohol, or the like], aliphatic hydrocarbons [for example, hexane, heptane, cyclohexane, or the like], nitrogen-containing materials [for example, N-methyl-2-pyrrolidone, N,N-dimethyl formamide, or the like], and water. These solvents may be used, either singly or in a mixture of two or more kinds.

Especially, as for the solvent used in this reaction system, it is preferable to use a solvent different from the solvent described below that is used to contain the hydrolysis condensate. Further, it is more preferable to use alcohol compounds having 1 to 5 carbon atoms, or ether compounds having 2 to 6 carbon atoms.

As for the conditions (temperature, period of time, and amount of solvent) for the hydrolysis reaction and the condensation reaction, optimum conditions are appropriately selected in accordance with the kind of materials to be used.

The weight average molecular weight of the hydrolysis condensate used in the present invention is from 1,000 to 50,000. Especially, the weight average molecular weight is preferably from 3,000 to 45,000, more preferably from 4,500 to 25,000, and particularly preferably from 5,000 to 25,000. By controlling the weight average molecular weight within the above range, an especial excellent embedding property for the inside of the gap can be realized, which is preferable. In the case where the weight average molecular weight is the above-described lower limit or more, a coating property for the semiconductor substrate is especially good and the surface state after coating is favorably maintained, which is preferable. In the case where the weight average molecular weight is the above-described upper limit or less, the embedding property is favorably realized, which is preferable.

Herein, the weight average molecular weight is a value that is obtained by measurement using a known GPC (Gel Permeation Chromatography) and standard polystyrene conversion. Unless indicated differently, the GPC measurement is conducted as follows. WATERS 2695 and GPC column KF-805L (3 columns in tandem) manufactured by Shodex are used as a column. To the column having a column temperature of 40° C., 50 μL of a tetrahydrofuran solution having a sample density of 0.5% by mass is poured. Tetrahydrofuran is flowed as an eluate solvent at the flow rate of 1 mL per minute. A sample peak is detected using a RI detecting device (WATERS 2414) and a UV detecting device (WATERS 2996).

The content of the hydrolysis condensate in the composition of the present invention is preferably more than 2.5% by mass and 15% by mass or less, more preferably more than 2.5% by mass and 10% by mass or less, and particularly preferably more than 3% by mass and 8% by mass or less, with respect to a total mass of the composition. In the case where the content is the above-described lower limit or more, an embedding property is especially good because generation of voids in the gap is prevented. In the case where the content is the above-described upper limit or less, a film thickness becomes satisfactorily thick, which does not cause crack or the like, and which is good in practicality. Further, examples of the component other than the hydrolysis condensate in the composition include solvents described above. Though the content of the solvent is not limited in particular, usually, it is preferable that the content is from 70% by mass to less than 97.5% by mass.

<Solvent>

From the purpose of using the composition as a reverse material, it is preferable that the solvent has a high solubility or dispersibility of the above-described hydrolysis condensate, while a low solubility of the photosensitive resin (resist). Further, in the present invention, a hydrolysis condensate of the above-described aryloxysilane raw material which is not a conventional hydrolysis condensate of the alkylalkoxysilane raw material is used. In consideration of conformation to this hydrolysis condensate, which can result in exertion of the above-described good properties, an aromatic compound is used as a solvent for the gap embedding composition of the present invention. Aromatic compounds having total carbon atoms of from 6 to 9 are preferably used. Aromatic compounds having total carbon atoms of from 7 to 9 are more preferable. The aryl compound may have a substituent; however, in the case where the substituent has a carbon atom, the carbon number of the molecule as a whole is within the range of the above-described total carbon atom.

Examples of the substituent include a halogen atom, an alkyl group (including a cycloalkyl group and a bicycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, a carbamoyl group, an arylor heterocyclic-azo group, an imido group, a phosphino group, a phosphinyl group, a phosphinyloxy group, a phosphinylamino group, and a silyl group. Among these, an alkyl group (including a cycloalkyl group and a bicycloalkyl group), an alkenyl group (including a cycloalkenyl group and a bicycloalkenyl group), an aryl group, a carboxyl group, an alkoxy group, an amino group (including an anilino group), an acyl group, an imido group and a silyl group are preferable. In a more preferable embodiment, it is better that the aryl compound does not have a substituent.

The above-described aromatic compound is preferably a liquid at the treatment temperature (from 20 to 40° C.) for using a composition. Specifically, benzene compounds having the above-described substituent are exemplified. Among these substituents, a hydrogen atom; a lower alkyl group such as a methyl group, an ethyl group, a propyl group, a 1-methylethyl group, a butyl group, a 1-methylpropyl group, a 2-methylpropyl group, a 1,1-dimethylethyl group, a pentyl group, a hexyl group, a heptyl group, and an octyl group; a fluorine atom, a chlorine atom, a bromine atom, an iodide atom; a methoxy group, an ethoxy group, a propoxy group, an isopropoxy group, a butoxy group, an isobutoxy group, a sec-butoxy group, a tert-butoxy group, a pentyloxy group, and a hexyloxy group are preferable. A methyl group and a 1-methylethyl group are more preferable. Although the number of the substituent on the benzene ring is not limited in particular, the number is preferably from more than 0 to 4, and more preferably from 1 to 3. Examples of the aromatic compound include mesitylene, cumene, xylene, toluene and benzene.

Any component other than the above-described aromatic compound may be contained in the solvent used in the gap embedding composition of the present invention. The content of the aryl compound in the solvent is preferably from 80 to 100% by mass, and more preferably from 85 to 100% by mass. In the case where the content of the compound is the lower limit or more, a coating property becomes favorable, which is preferable. In the case where the content of the compound is the upper limit or less, a coating property also becomes favorable, which is preferable. Especially, from the viewpoints of maintaining both coating property and embedding property by incorporating therein the hydrolysis condensate having a high molecular weight as described above, it is preferable to use the organic solvents in the above particular range.

<Semiconductor Substrate>

The material for composing a semiconductor substrate is not limited in particular. Examples of the material include silicon, silicon carbide, metals (gold, silver, copper, nickel, aluminum, or the like), a metal nitride (silicon nitride, titanium nitride, tantalum nitride, tungsten nitride, or the like), glass (quartz glass, borosilicate glass, soda-lime glass, or the like), a resin (polyethylene terephtharate, polyimide, or the like), and a insulating film (silicon oxide, titanium oxide, zirconium oxide, hafnium oxide, or the like). The term "semiconductor substrate" used in the present invention includes not only a silicon wafer, but also a substrate in which a predetermined material or the like has been fabricated and applied. Further, the semiconductor substrate may have a laminate structure in which layers including these materials have been laminated. The workpiece material film 2 in an example shown in FIG. 1 may be designed to be the above-described insulating film, a semiconductor film, a conductor film, or the like, disposed on the silicon wafer 3. Further, a conformation may be different from the graphically-illustrated one. The conformation may be designed such that a functional material such as an organic antireflection film is applied to a layer between the above-described workpiece material film and the resist pattern formed by the photosensitive resin.

Before forming the resist film, an antireflection film may be previously provided by coating on the semiconductor substrate.

The antireflection film used may be either an inorganic film type such as titanium, titanium dioxide, titanium nitride, chromium oxide, carbon and amorphous silicon; or an organic film type composed of a light absorber and a polymer material. Further, a commercially available organic antireflection film such as DUV30 Series and DUV-40 Series produced by Brewer Science, Inc., ARC20/90 Series produced by Nissan Chemical Industries, LTD. and AR-2, AR-3 and AR-5 produced by Shipley Co., Ltd. can be used as the organic antireflection film. In the preferable embodiment of the present invention, the organic film type is preferable.

<Photosensitive Resin>

Photosensitive Resin Material

In the present invention, ordinary photo resists used for manufacturing of the semiconductor substrate may be used as the photosensitive resin. The kind of the resist is not limited in particular, and may be selected in accordance with the intended use. Examples of the resist include an acrylic-series resin, a silicone-series resin, a fluororesin, a polyimide-series resin, a polyolefin-series resin, an alicyclic olefin-series resin, and an epoxy-series resin. Specific examples include photosensitive resins described in JP-A-2000-319396, JP-A-2001-92154, JP-A-2002-372784, JP-A-2002-244280, JP-A-2003-57826, JP-A-2005-220066, JP-A-2007-212863, JP-A-2008-250191, JP-A-2008-268915, JP-A-2009-35745, and JP-A-2009-96991. Although the photosensitive resin is not limited thereto, the acrylic-series resin is preferable.

Pattern Forming Method

A method of forming a pattern on a semiconductor substrate using the above-described photosensitive resin is not limited in particular. A method that is usually used for manufacturing of the semiconductor substrate may be used. In the case where an ordinary photolithography is used, the photolithography is conducted via an embodiment of processes including: coating the above-described photosensitive resin on a semiconductor substrate using a spin coater or the like; and exposing the photosensitive resin through a reticle by means of a stepper to cure the photosensitive resin, thereby forming a desirably patterned photosensitive resin. Then, uncured portions of the photosensitive resin are removed by washing or ashing, thereby forming a photosensitive resin pattern in which a desirably patterned gap (hole or trench) has been formed. As for the patterning technique, an immersion method, or a double patterning technique may be used instead of ordinary methods.

Exposing Wavelength

As a wavelength source for the exposing step in the present invention, KrF, ArF, EUV, electron beam, or X-ray may be used. Especially, EUV is preferable. ArF or EUV-sensitive resins are described in detail below.

The photosensitive resin in the preferable embodiment of the present invention is a composition containing (A) a resin capable of decomposing by the action of an acid to increase the dissolution rate in an alkaline aqueous solution, (B) a compound capable of generating an acid upon irradiation with actinic rays or radiation, (C) a basic compound, and (D) an organic solvent, wherein a total solid content concentration of the composition is from 1.0 to 4.5% by mass, and a rate of the (B) compound that generates an acid by irradiating with actinic light rays or radiation to the total solid content is from 10 to 50% by mass.

[1] (A) Resin Capable of Decomposing by the Action of an Acid to Increase the Dissolution Rate in an Alkali Developer The resin capable of decomposing by the action of an acid to increase the dissolution rate in an alkali developer (hereinafter, also referred to as an "acid-decomposable resin"), used in the positive resist composition of the preferable embodiment of the present invention, is a resin having a group capable of decomposing by the action of an acid (acid-decomposable group) to produce an alkali-soluble group, in the main or side chain or both the main and side chains of the resin. Of these, a resin having an acid-decomposable group in the side chain is preferred.

The acid-decomposable group is preferably a group where the hydrogen atom of an alkali-soluble group such as —COOH group and —OH group is substituted by a group capable of leaving by the action of an acid. In the preferable embodiment of the present invention, the acid-decomposable group is preferably an acetal group or a tertiary ester group. In the case where such a group capable of decomposing by the action of an acid is bonded as a side chain, a matrix resin is an alkali-soluble resin having a —OH or —COOH group in the side chain. Examples thereof include an alkali-soluble resin described below. The alkali dissolution rate of the alkali-soluble resin when formed into a resist film is preferably 80 Å/sec or more, more preferably 160 Å/sec or more, as measured (at 23° C.) in 0.261N tetramethylammonium hydroxide (TMAH).

The acid-decomposable resin preferably contains a repeating unit having an aromatic group and, in particular, an acid-decomposable resin containing a hydroxystyrene repeating unit is preferred (hereinafter, also referred to as a "resin (A1)"). The acid-decomposable resin is more preferably a copolymer of hydroxystyrene/hydroxystyrene protected by an acid-decomposable group, or a copolymer of hydroxystyrene/tertiary alkyl(meth)acrylate.

The content of the group capable of decomposing by the action of an acid is expressed by B/(B+S) using the number (B) of groups capable of decomposing by the action of an acid and the number (S) of alkali-soluble groups not protected by a group capable of leaving by the action of an acid, in the resin. The content is preferably from 0.01 to 0.7, more preferably from 0.05 to 0.50, still more preferably from 0.05 to 0.40.

The resin (A1) is preferably a resin having either one of a repeating unit represented by the following formula (II) and a repeating unit represented by formula (III), or both of them.

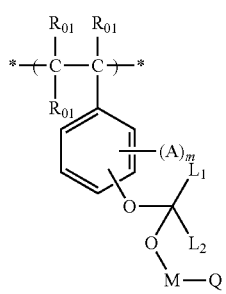

(II)

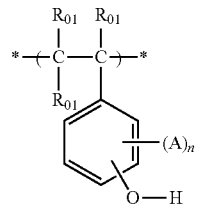

(III)

In formulae (II) and (III), each $R_{01}$ independently represents a hydrogen atom, an alkyl group, a cycloalkyl group, a halogen atom, a cyano group or an alkoxycarbonyl group.

Each of $L_1$ and $L_2$, which may be the same or different, represents a hydrogen atom, an alkyl group, a cycloalkyl group or an aralkyl group.

M represents a single bond or a divalent linking group.

Q represents an alkyl group, a cycloalkyl group, an aryloxy group or an alicyclic or aromatic ring group which may contain a heteroatom.

At least two members out of Q, M and $L_1$ may combine to form a 5- or 6-membered ring.

A represents, when a plurality of A's are present, each independently represents, a halogen atom, a cyano group, an acyl group, an alkyl group, an alkoxy group, an acyloxy group or an alkoxycarbonyl group.

Each of m and n independently represents an integer of 0 to 4, provided that m and n are preferably not 0 at the same time.

The content of the repeating unit represented by formula (II) is preferably from 5 to 60 mol %, more preferably from 10 to 50 mol %, particularly preferably from 10 to 40 mol %, based on all repeating units constituting the resin.

The content of the repeating unit represented by formula (III) is preferably from 40 to 90 mol %, more preferably from 45 to 80 mol %, particularly from 50 to 75 mol %, based on all repeating units constituting the resin.

Synthesis of the resin (A1) can be performed by polymerization in accordance with any one method of radical polymerization, anion polymerization, and cation polymerization. The radical polymerization method is preferable from the viewpoint of polymerization reaction control. Further, living radical polymerization method is preferable from the viewpoints of molecular weight and molecular weight distribution control. Specific examples of the synthesis include a method of using a compound selected from a nitroxide compound, a compound used in atom transfer polymerization method, and a RAFT agent, and a radical polymerization initiator (azo-based or peroxide-based initiators) in combination. Introduction of the acid-decomposable protective group can be performed by any one of the method of copolymerizing monomers having acid-decomposable protective groups and the method of introducing a protective group into a resin having an alkali-soluble hydroxyl group such as a phenolic hydroxyl group, or having a carboxyl group. The resin (A1) may be also synthesized by a known synthesis method described in European Patent 254853, JP-A-2-258500, JP-A-3-223860 and JP-A-4-251259, for example, a method of reacting a precursor of a group capable of decomposing by the action of an acid with an alkali-soluble resin or a method of copolymerizing monomers having a group capable of decomposing by the action of an acid with various monomers. The synthesized resin is usually used for a resist composition after purifying impurities such as unreacted monomers which may adversely affect a desirable property, in accordance with a method such as reprecipitation or washing each of which is ordinary in the macromolecule synthesis.

The weight average molecular weight of the resin (A1) is, as a polystyrene-reduced value by the GPC method, preferably 15,000 or less, more preferably from 1,000 to 10,000, further preferably from 1,500 to 5,000, and particularly preferably from 2,000 to 3,000.

The polydispersity (Mw/Mn) of the resin (A1) is preferably from 1.0 to 3.0, more preferably from 1.05 to 2.0, still more preferably from 1.1 to 1.7.

As for the resin (A1), two or more kinds of resins may be used in combination.

Specific examples of the resin (A) are described below, but the present invention is not limited thereto.

(R-1)
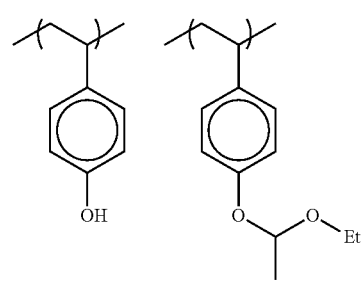

(R-2)
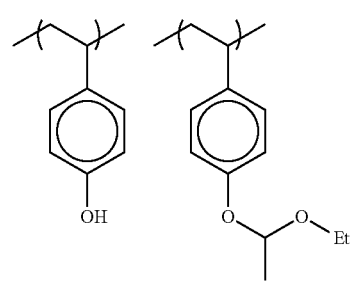

(R-3)
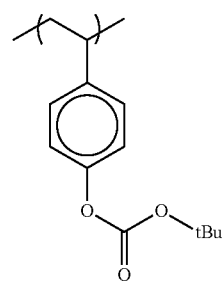

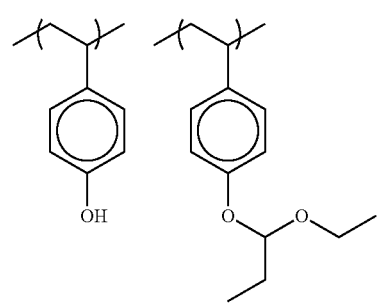

-continued

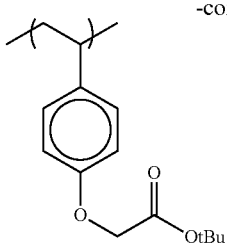

(R-4)
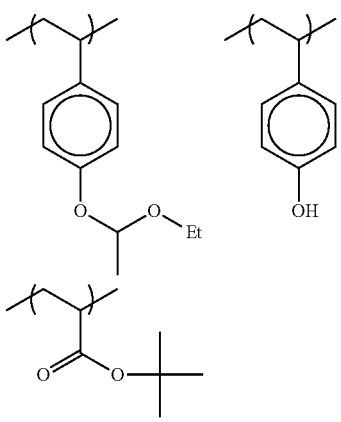

(R-5)
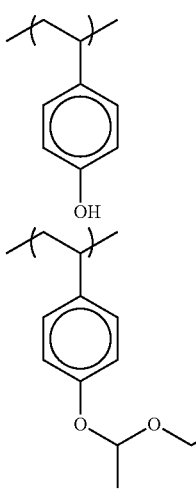

(R-6)
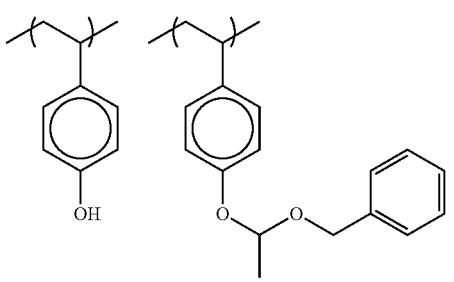

(R-7)
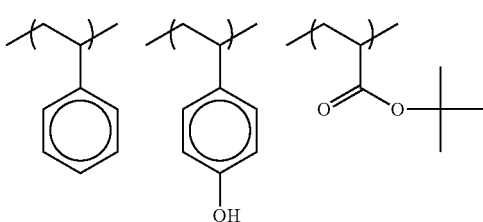

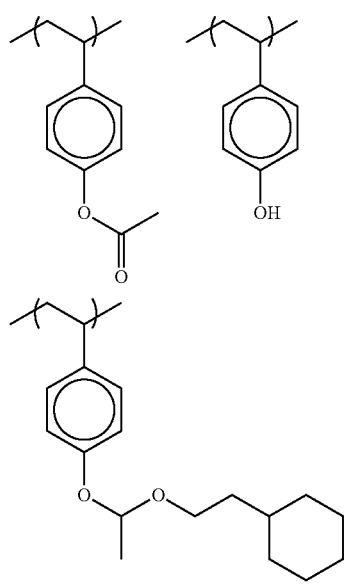
(R-8)
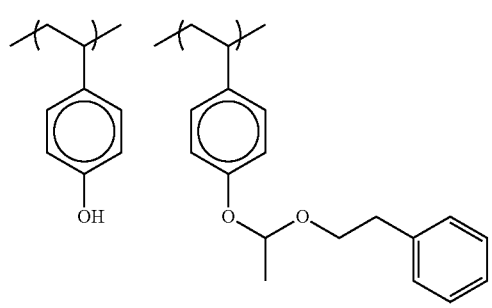
(R-9)
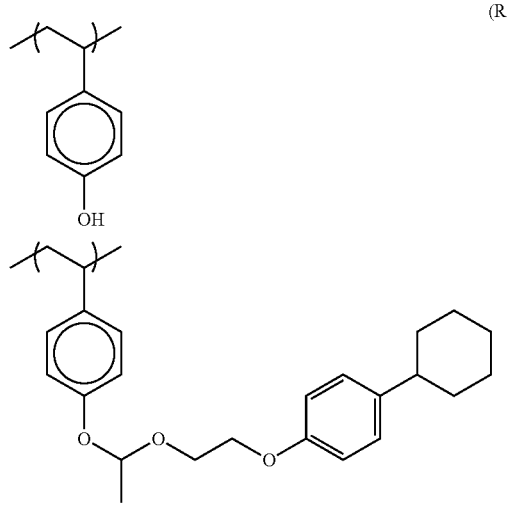
(R-10)
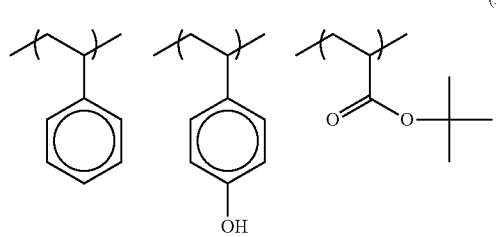
(R-11)
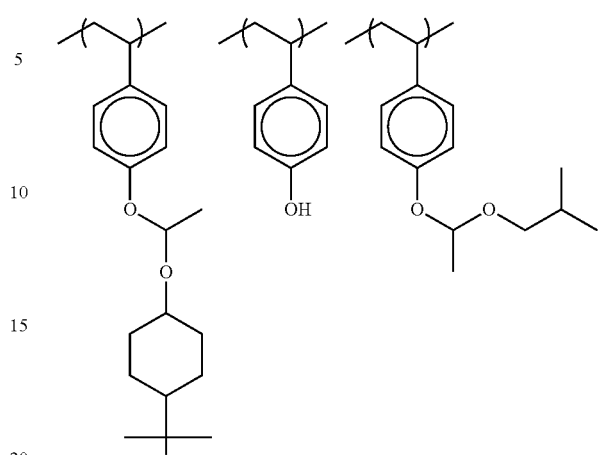
(R-12)
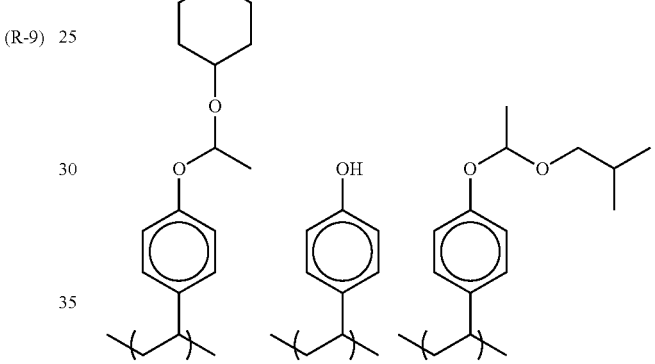
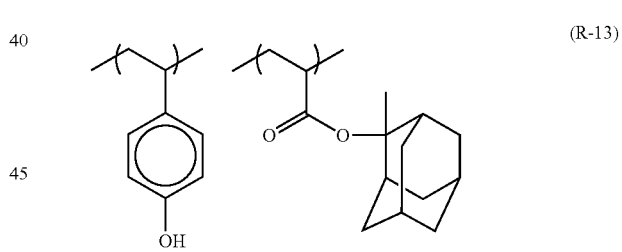
(R-13)
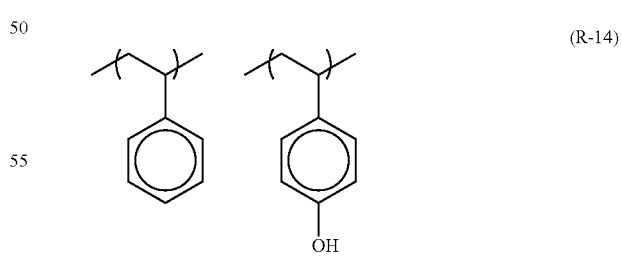
(R-14)
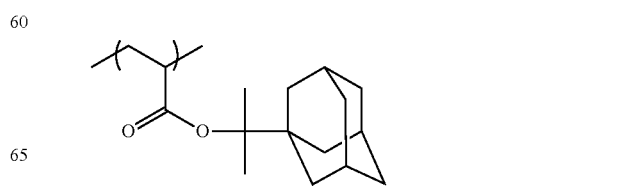

(R-15)
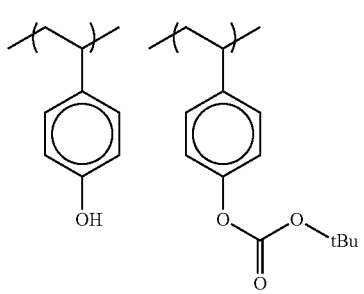
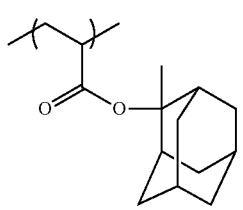
(R-16)
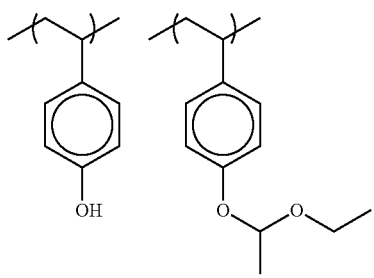
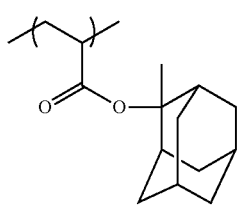
(R-17)
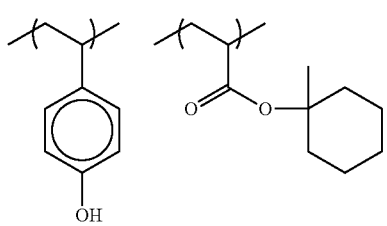
In specific examples above, tBu indicates a tert-butyl group.
(1)
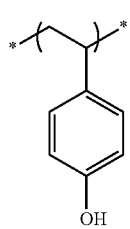
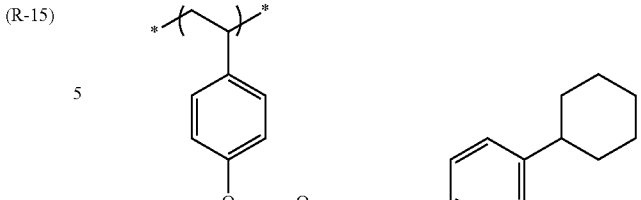
(2)
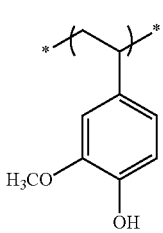
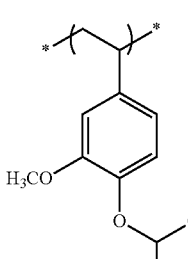
(3)
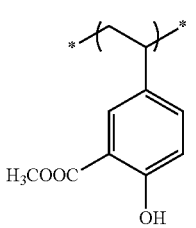
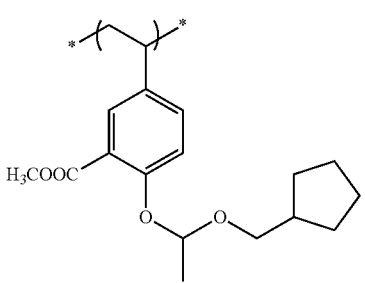

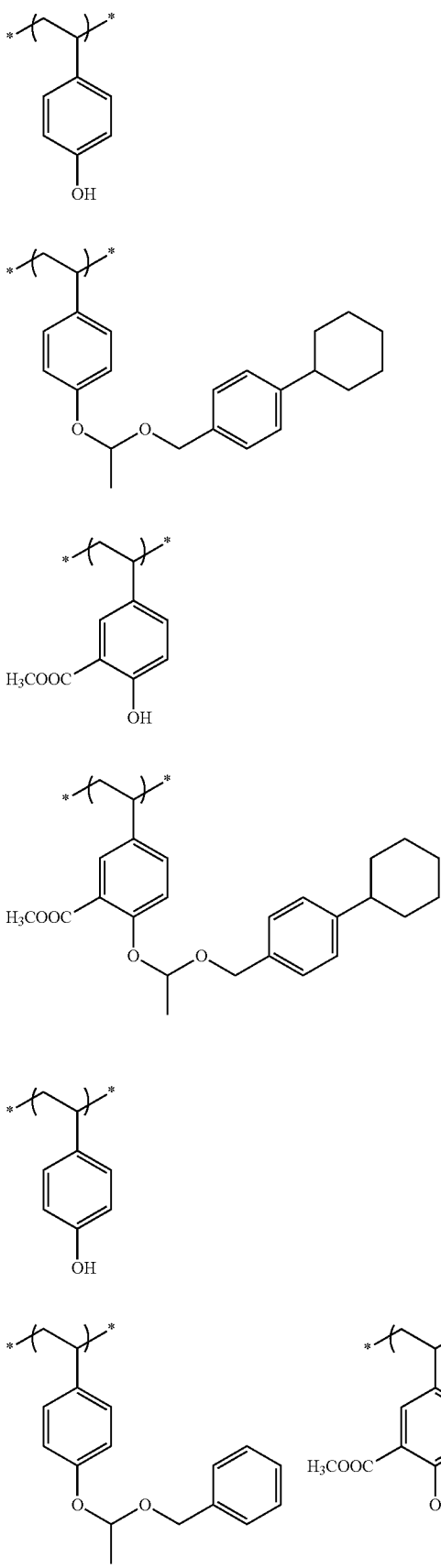

(4)

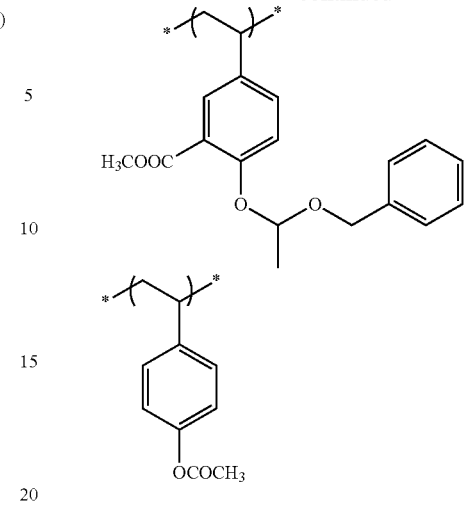

(5)

In the positive resist composition of the preferable embodiment of the present invention, the blending amount of the acid-decomposable group in the composition is preferably from 45 to 90 mass %, more preferably from 55 to 85 mass %, still more preferably from 60 to 80 mass %, based on the entire solid content of the composition.

[2] (B) Compound Capable of Generating an Acid Upon Irradiation with an Actinic Ray or Radiation (Acid Generator)

The acid generator which can be used may be appropriately selected from a photoinitiator for photocationic polymerization, a photoinitiator for photoradical polymerization, a photo-decoloring agent for coloring matters, a photo-discoloring agent, a known compound generating an acid upon irradiation with actinic rays or radiation, used for microresist or the like, and a mixture thereof.

Examples thereof include a diazonium salt, a phosphonium salt, a sulfonium salt, an iodonium salt, imidosulfonate, oxime sulfonate, diazodisulfone, disulfone and o-nitrobenzyl sulfonate.

Further, a compound where such a group or compound capable of generating an acid upon irradiation with actinic rays or radiation is introduced into the main or side chain of a polymer, for example, compounds described in U.S. Pat. No. 3,849,137, German Patent No. 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent No. 126,712 may also be used.

As the compounds capable of generating an acid upon irradiation with actinic rays or radiation, the compounds represented by any one of the following formulae (ZI), (ZII) and (ZIII) are exemplified.

ZI $$R_{202}-\overset{R_{201}}{\underset{R_{203}}{S^+}}\ Z^-$$

ZII $$R_{204}-I_+-R_{205}\quad Z^-$$

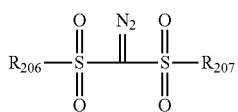

In formula (ZI), each of $R_{201}$, $R_{202}$ and $R_{203}$ independently represents an organic group.

The carbon number of the organic group as $R_{201}$, $R_{202}$ and $R_{203}$ is usually from 1 to 30, preferably from 1 to 20.

Two members out of $R_{201}$ to $R_{203}$ may combine to form a ring structure, and the ring may contain an oxygen atom, a sulfur atom, an ester bond, an amide bond, or a carbonyl group.

The group formed by combining two members out of $R_{201}$ to $R_{203}$ includes an alkylene group (e.g., butylene, pentylene).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris-(alkylsulfonyl)methyl anion.

The non-nucleophilic anion is an anion having an extremely low ability of causing a nucleophilic reaction and this anion can suppress the decomposition with aging due to intramolecular nucleophilic reaction. By virtue of this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group and is preferably an alkyl group having 1 to 30 carbon atoms or a cycloalkyl group having 3 to 30 carbon atoms. Examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having 6 to 14 carbon atoms, and examples thereof include a phenyl group, a tolyl group and a naphthyl group.

The alkyl group, cycloalkyl group and aryl group in the aliphatic sulfonate anion and aromatic sulfonate anion each may have a substituent. Examples of the substituent of the alkyl group, cycloalkyl group and aryl group in the aliphatic sulfonate anion and aromatic sulfonate anion include a nitro group, a halogen atom (e.g., fluorine atom, chlorine atom, bromine atom, iodine atom), a carboxyl group, a hydroxyl group, an amino group, a cyano group, an alkoxy group (preferably having 1 to 5 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms). As for the aryl group or ring structure in each group, examples of the substituent further include an alkyl group (preferably having 1 to 15 carbon atoms).

Examples of the aliphatic moiety in the aliphatic carboxylate anion include the same alkyl group and cycloalkyl group as in the aliphatic sulfonate anion.

Examples of the aromatic group in the aromatic carboxylate anion include the same aryl group as in the aromatic sulfonate anion.

The aralkyl group in the aralkylcarboxylate anion is preferably an aralkyl group having 6 to 12 carbon atoms, and examples thereof include a benzyl group, a phenethyl group, a naphthylmethyl group, a naphthylethyl group and a naphthylmethyl group.

The alkyl group, cycloalkyl group, aryl group and aralkyl group in the aliphatic carboxylate anion, aromatic carboxylate anion and aralkylcarboxylate anion each may have a substituent. Examples of the substituent of the alkyl group, cycloalkyl group, aryl group and aralkyl group in the aliphatic carboxylate anion, aromatic carboxylate anion and aralkylcarboxylate anion include the same halogen atom, alkyl group, cycloalkyl group, alkoxy group and alkylthio group as in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group and an alkylthio group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted by a fluorine atom at the α-position of the sulfonic acid, an aromatic sulfonate anion substituted by a fluorine atom or a group having a fluorine atom, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion having 4 to 8 carbon atoms or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

Examples of the organic group of $R_{201}$, $R_{202}$ and $R_{203}$ in formula (ZI) include the corresponding groups in the compounds (ZI-1), (ZI-2) and (ZI-3) described later.

The compound may be a compound having a plurality of structures represented by formula (ZI), for example, may be a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from pyrrole), a furan residue (a group formed by removing one hydrogen atom from furan), a thiophene residue (a group formed by removing one hydrogen atom from thiophene), an indole residue (a group formed by removing one hydrogen atom from indole), a benzofuran residue (a group formed by removing one hydrogen atom from benzofuran) and a benzothiophene residue (a group formed by removing one hydrogen atom from benzothiophene). In the case where the arylsulfonium compound has two or more aryl groups, each of these two or more aryl groups may be the same as or different from each other.

The alkyl or cycloalkyl group which is present, according to the necessity, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of usually from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, particularly preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl group, ethyl group, propyl group, butyl group, pentyl group) and a cycloalkyl group having a carbon number of 3 to 10 (e.g., cyclopentyl group, cyclohexyl group, norbornyl group). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having $>C=O$ at the 2-position of the above-described alkyl group.

The 2-oxocycloalkyl group is preferably a group having $>C=O$ at the 2-position of the above-described cycloalkyl group.

The alkoxy group in the alkoxycarbonylmethyl group is preferably an alkoxy group having a carbon number of 1 to 5 (e.g., methoxy group, ethoxy group, propoxy group, butoxy group, pentoxy group).

Each of $R_{201}$ to $R_{203}$ may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

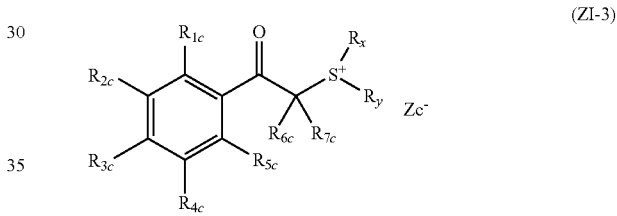

(ZI-3)

In formula (ZI-3), each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more members out of $R_{1c}$ to $R_{5c}$, a pair of $R_{6c}$ and $R_{7c}$, or a pair of $R_x$ and $R_y$, may combine together to form a ring structure. This ring structure may contain an oxygen atom, a sulfur atom, an ester bond or an amido bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having 1 to 20 carbon atoms, preferably a linear or branched alkyl group having 1 to 12 carbon atoms (e.g., a methyl group, an ethyl group, a linear or branched propyl group, a linear or branched butyl group, a linear or branched pentyl group). The cycloalkyl group is, for example, a cycloalkyl group having 3 to 8 carbon atoms (e.g., a cyclopentyl group, a cyclohexyl group).

The alkoxy group as $R_{1c}$ to $R_{5c}$ may be linear, branched or cyclic and is, for example, an alkoxy group having 1 to 10 carbon atoms, preferably a linear or branched alkoxy group having 1 to 5 carbon atoms (e.g., a methoxy group, an ethoxy group, a linear or branched propoxy group, a linear or branched butoxy group, a linear or branched pentoxy group) or a cyclic alkoxy group having 3 to 8 carbon atoms (e.g., a cyclopentyloxy group, a cyclohexyloxy group).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of such a compound, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group in $R_{1c}$ to $R_{5c}$.

$R_x$ and $R_y$ each is preferably an alkyl or cycloalkyl group having 4 or more carbon atoms, more preferably 6 or more carbon atoms, still more preferably 8 or more carbon atoms.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene).

The alkyl group or cycloalkyl group in $R_{204}$ to $R_{207}$ is preferably a linear or branched alkyl group having 1 to 10 carbon atoms (e.g., a methyl group, an ethyl group, a propyl group, a butyl group, a pentyl group) or a cycloalkyl group having 3 to 10 carbon atoms (e.g., a cyclopentyl group, a cyclohexyl group, a norbornyl group).

The aryl group, alkyl group and cycloalkyl group of $R_{204}$ to $R_{207}$ each may have a substituent. Examples of the substituent which the aryl group, alkyl group and cycloalkyl group of $R_{204}$ to $R_{207}$ each may have include an alkyl group (for example, an alkyl group having 1 to 15 carbon atoms), a cycloalkyl group (for example, a cycloalkyl group having a 3 to 15 carbon atoms), an aryl group (for example, an aryl group having 6 to 15 carbon atoms), an alkoxy group (for example, an alkoxy group having 1 to 15 carbon atoms), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the compound capable of generating an acid upon irradiation with actinic rays or radiation, which can be used, include the compounds represented by any one of the following formulae (ZIV), (ZV) and (ZVI).

ZIV

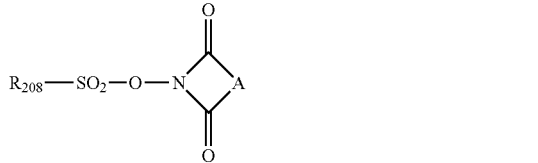

ZV

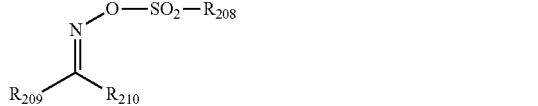

ZVI

In formulae (ZIV) to (ZVI), $Ar_3$ and $Ar_4$ each independently represents an aryl group. $R_{208}$, $R_{209}$ and $R_{210}$ each independently represents an alkyl group, a cycloalkyl group or an aryl group.

A represents an alkylene group, an alkenylene group or an arylene group.

Among the compounds capable of generating an acid upon irradiation with actinic rays or radiation, more preferred are the compounds represented by any one of formulae (ZI) to (ZIII).

The compound capable of generating an acid upon irradiation with actinic rays or radiation is preferably a compound that generates an acid having one sulfonic acid group or imide group, more preferably a compound that generates a monovalent perfluoroalkanesulfonic acid, a compound that generates an aromatic sulfonic acid substituted by a monovalent fluorine atom or a fluorine atom-containing group, or a compound that generates an imide acid substituted by a monovalent fluorine atom or a fluorine atom-containing group, still more preferably a sulfonium salt of fluoro-substituted alkanesulfonic acid, a fluorine-substituted benzenesulfonic acid or a fluorine-substituted imide acid. In particular, the acid generated from the acid generator which can be used is preferably a fluoro-substituted alkanesulfonic acid, a fluoro-substituted benzenesulfonic acid or a fluoro-substituted imide acid having a pKa of −1 or less and in this case, the sensitivity can be enhanced.

Among the compounds capable of generating an acid upon irradiation with actinic rays or radiation, particularly preferred compounds are set forth below.

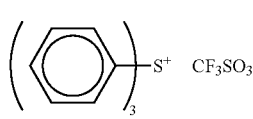

(z1)

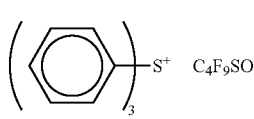

(z2)

-continued
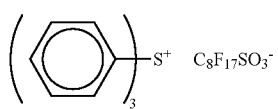 (z3)
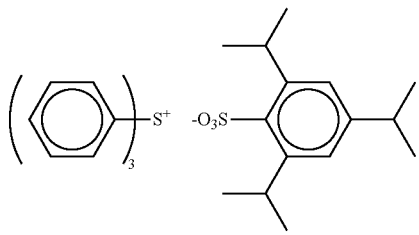 (z4)
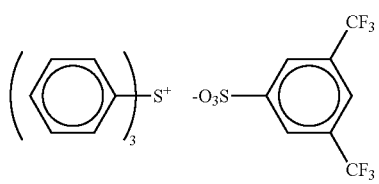 (z5)
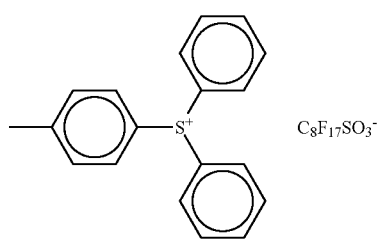 (z6)
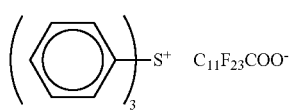 (z7)
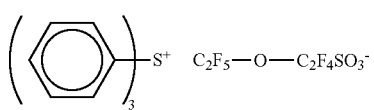 (z8)
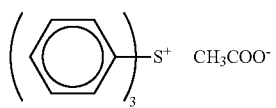 (z9)
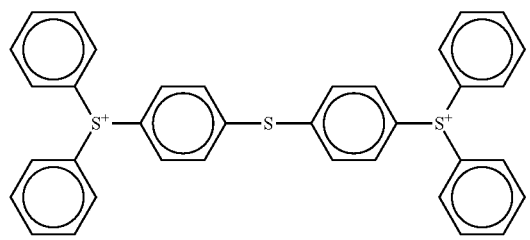 (z10)
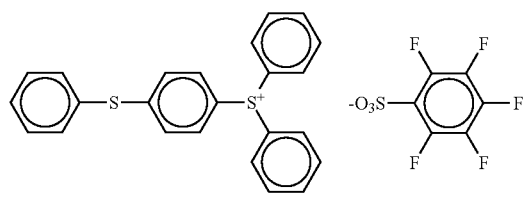 (z11)
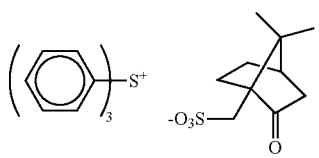 (z12)
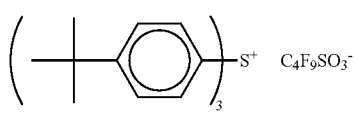 (z13)
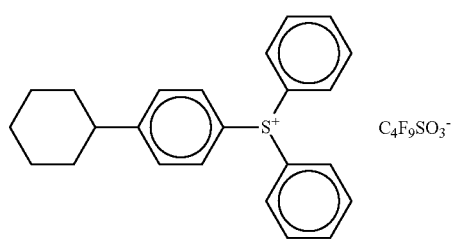 (z14)

-continued
z(15)
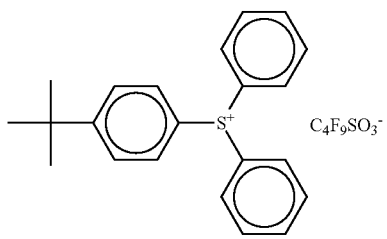
z(16)
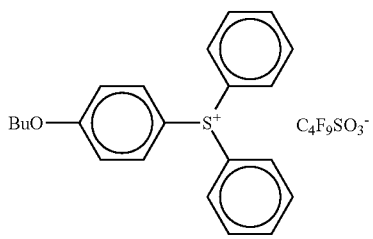
z(17)
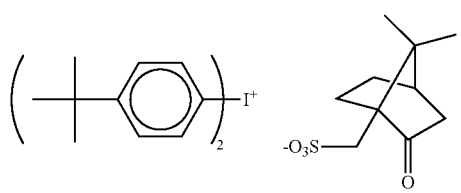
(z18)
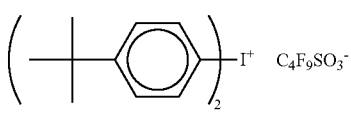
(z19)
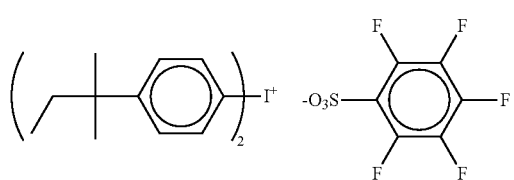
(z20)
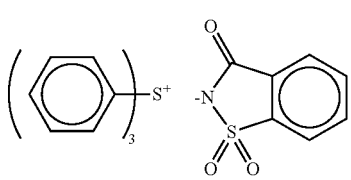
(z21)
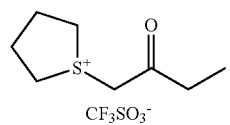
(z22)
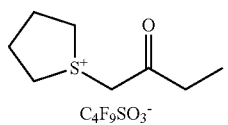
(z23)
(z24)
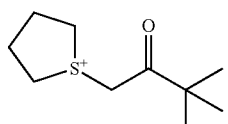
(z25)
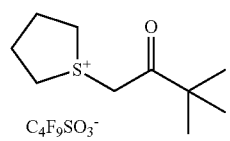
(z26)
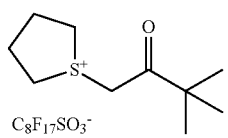
(z27)
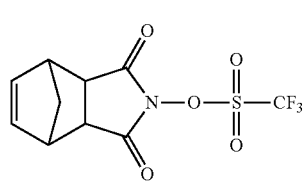
(z28)
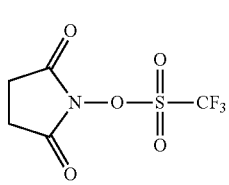
(z29)
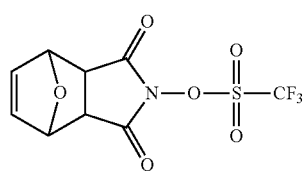
(z30)
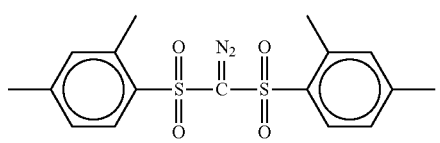
(z31)
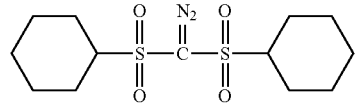
(z32)
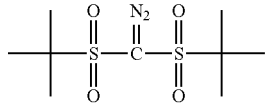

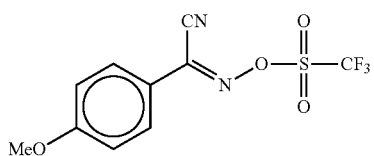
(z33)
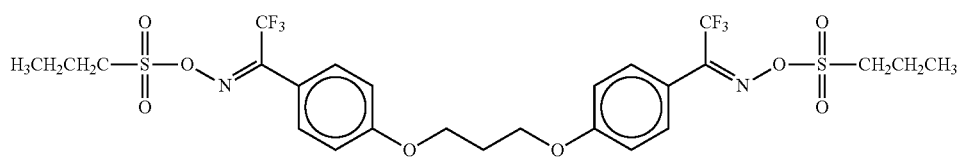
(z34)
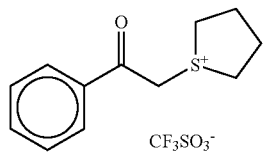
(z35)
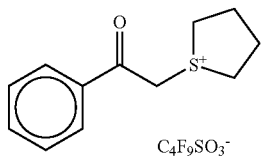
(z36)
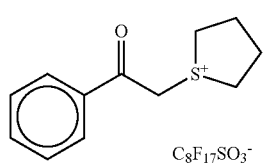
(z37)
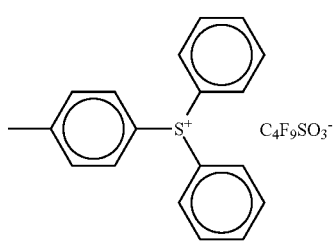
(z38)
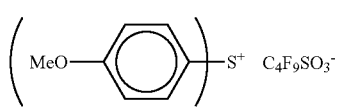
(z39)
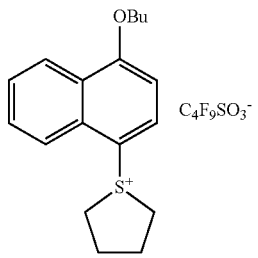
(z40)
(z41)
(z42)
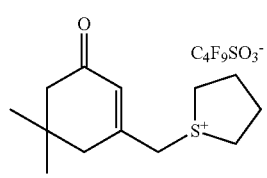
(z43)
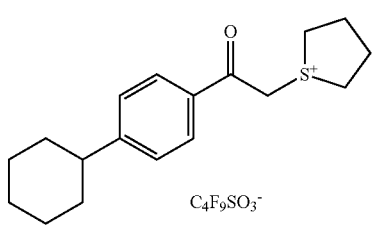
(z44)
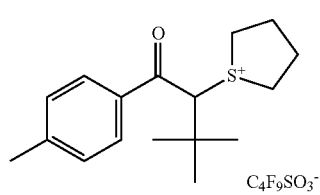
(z45)
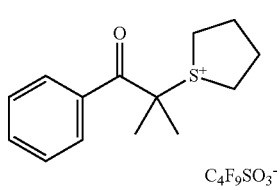
(z46)

-continued
(z47) 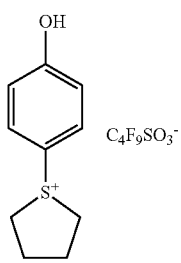
(z48) 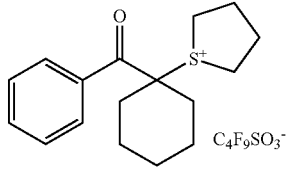
(z49) 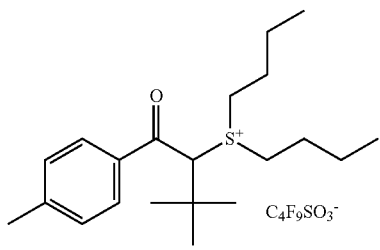
(z50) 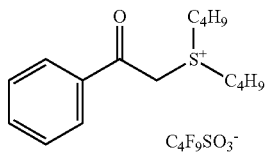
(z51) 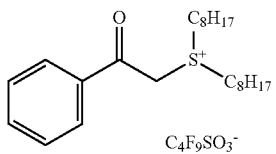
(z52) 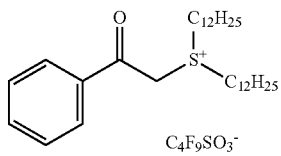
(z53) 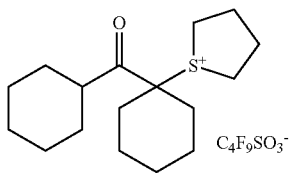
(z54) 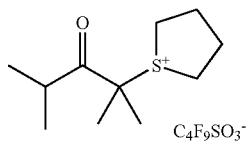
(z55) 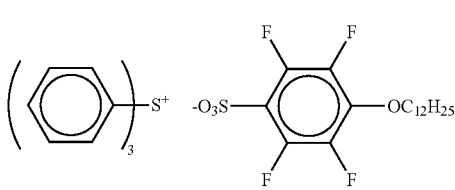
(z56) 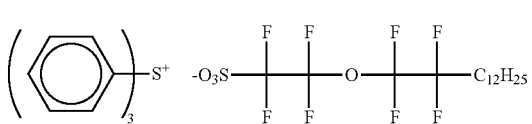
(z57) 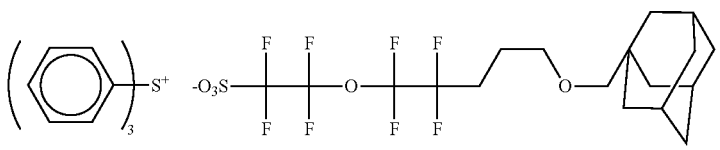
(z58) 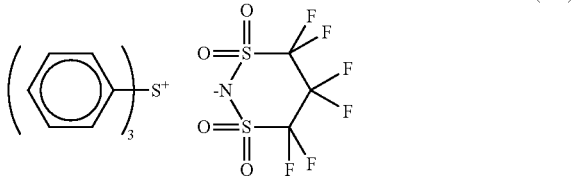
(z59) 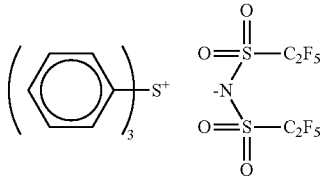
(z60) 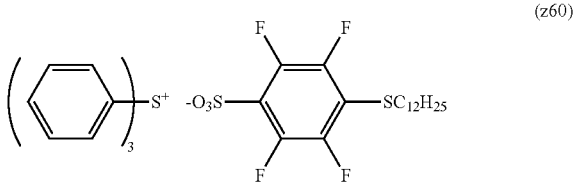
(z61) 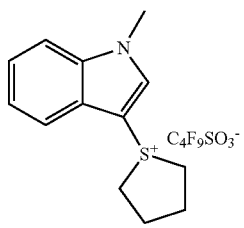

-continued

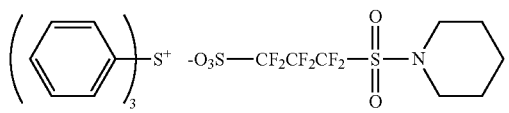
(z62)

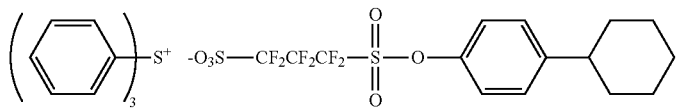
(z63)

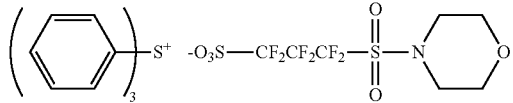
(z64)

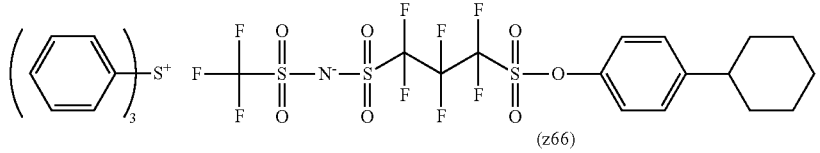
(z65)

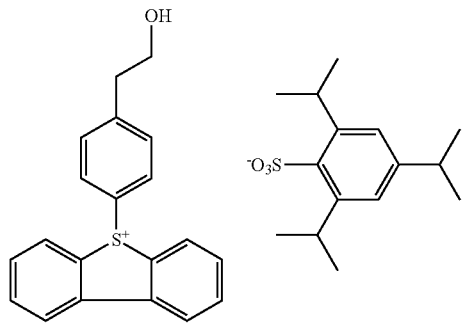
(z66)

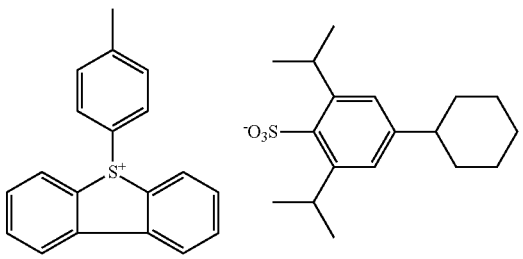
(z67)

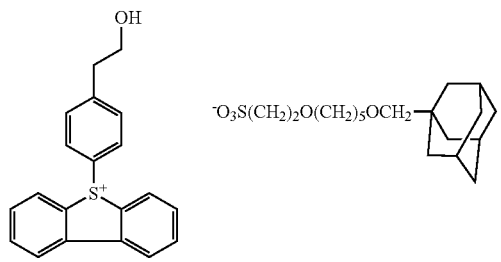
(z68)

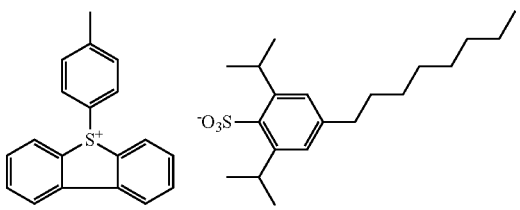
(z69)

One kind of an acid generator may be used alone or two or more kinds of acid generators may be used in combination.

In the preferable embodiment of the present invention, the content of the acid generator is from 10 to 50 mass %, preferably from 20 to 50 mass %, more preferably from 22 to 50 mass %, particularly preferably from 25 to 50 mass %, yet still more preferably from 25 to 40 mass %, based on the entire solid content of the composition.

In ArF or KrF exposure, the energy of light incident on the resist is absorbed by the photoacid generator, and the photoacid generator in an excited state decomposes to generate an acid. Accordingly, the absorption ratio of incident light is determined by the molecular extinction coefficient of the photoacid generator or the concentration of the photoacid generator. On the other hand, in view of pattern profile, it is known that when the light absorption ratio of the resist becomes high and the transmittance dips below approximately 70%, the pattern profile worsens. Thus, there is naturally a limit on the concentration of the photoacid generator.

Whereas, in the EUV or EB exposure, the energy per one incident photon or one incident electron is very high as compared with the conventional ArF or KrF exposure, and the absorption ratio for the energy scarcely depends on the chemical structure of the resist and therefore, the concentration of the photoacid generator is considered to be not limited by the transmittance.

On the other hand, rise in the concentration of the photoacid generator is found to bring about mutual aggregation of the photoacid generator and cause reduction in the acid generation efficiency or deterioration of stability. In the preferable embodiment of the present invention, it has been found that even a photoacid generator in a high concentration, which has been substantially unusable in the conventional resist for ArF or KrF because of a problem in the transmittance or aggregation of photoacid generator, can be effectively used by optimizing the solid content concentration. This is an utterly unexpected effect but it is considered that by properly keeping the concentration of the photoacid generator in the resist solution state (this relates to the "entire solid content concentration" described later), the stable dispersed state can be maintained even after a resist film is formed.

[3] (C) Basic Compound

The resist composition of the preferable embodiment of the present invention preferably contains a basic compound for reducing the change in performance with aging from exposure until heating. The basic compound fulfills the role of quenching the deprotection reaction by the acid generated upon exposure, and the diffusivity or basicity of the basic compound affects the substantial acid diffusivity.

As for the preferred structure, the basic compound includes those having a structure represented by any one of the following formulae (A) to (E).

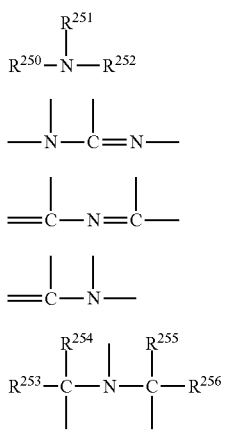

In formula (A), $R^{250}$, $R^{251}$ and $R^{252}$ each independently represents a hydrogen atom, an alkyl group (preferably having 1 to 20 carbon atoms), a cycloalkyl group (preferably having 3 to 20 carbon atoms), or an aryl group (preferably having 6 to 20 carbon atoms), and $R^{250}$ and $R^{251}$ may combine with each other to form a ring.

These groups each may have a substituent. The alkyl or cycloalkyl group having a substituent is preferably an aminoalkyl group having 1 to 20 carbon atoms, an aminocycloalkyl group having 3 to 20 carbon atoms, a hydroxyalkyl group having 1 to 20 carbon atoms, or a hydroxycycloalkyl group having 3 to 20 carbon atoms.

The alkyl chain thereof may contain an oxygen atom, a sulfur atom or a nitrogen atom.

In formula (E), $R^{253}$, $R^{254}$, $R^{255}$ and $R^{256}$ each independently represents an alkyl group (preferably having 1 to 6 carbon atoms) or a cycloalkyl group (preferably having 3 to 6 carbon atoms).

Preferred examples of the compound include guanidine, aminopyrrolidine, pyrazole, pyrazoline, piperazine, aminomorpholine, aminoalkylmorpholine and piperidine, and these compounds each may have a substituent. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]nona-5-ene and 1,8-diazabicyclo[5,4,0]undec-7-ene. Examples of the compound having an onium hydroxide structure include a triarylsulfonium hydroxide, a phenacylsulfonium hydroxide and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure is changed to a carboxylate, and examples thereof include acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Other examples include at least one nitrogen-containing compound selected from a phenoxy group-containing amine compound, a phenoxy group-containing ammonium salt compound, a sulfonic acid ester group-containing amine compound and a sulfonic acid ester group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms) may be bonded to the nitrogen atom in addition to the alkyl group.

The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms) may be bonded to the nitrogen atom in addition to the alkyl group.

The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

Examples of the anion of the ammonium salt compound include a halogen atom, a sulfonate, a borate and a phosphate, with a halogen atom and a sulfonate being preferred. The halogen atom is particularly preferably chloride, bromide or iodide, and the sulfonate is particularly preferably an organic sulfonate having 1 to 20 carbon atoms. The organic sulfonate includes an alkylsulfonate having 1 to 20 carbon atoms and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, buthanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring each may have a substituent, and the substituent is preferably a linear or branched alkyl group having 1 to 6 carbon atoms, or a cycloalkyl group having 3 to 6 carbon atoms. Specific examples of the linear or branched alkyl group and the cycloalkyl group include methyl, ethyl, n-propyl, isopropyl, n-butyl, i-butyl, tert-butyl, n-hexyl and cyclohexyl. Other examples of the substituent include an alkoxy group having 1 to 6 carbon atoms, a halogen atom, cyano, nitro, an acyl group and an acyloxy group.

The phenoxy group-containing amine compound and the phenoxy group-containing ammonium salt compound are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

The sulfonic acid ester group in the sulfonic acid ester group-containing amine compound and the sulfonic acid ester group-containing ammonium salt compound may be any of an alkylsulfonic acid ester, a cycloalkylsulfonic acid ester and an arylsulfonic acid ester. In the case of an alkylsulfonic acid ester, the alkyl group preferably has 1 to 20 carbon atoms; in the case of a cycloalkylsulfonic acid ester, the cycloalkyl group preferably has 3 to 20 carbon atoms; and in the case of an arylsulfonic acid ester, the aryl group preferably has 6 to 12 carbon atoms. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compounds preferably have at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

The phenoxy group-containing amine compound can be obtained by reacting a primary or secondary amine having a phenoxy group with a haloalkyl ether under heating, adding an aqueous solution of strong base such as sodium hydroxide, potassium hydroxide and tetraalkylammonium, and performing extraction with an organic solvent such as ethyl acetate and chloroform, or by reacting a primary or secondary amine with a haloalkyl ether having a phenoxy group at the terminal under heating, adding an aqueous solution of strong base such as sodium hydroxide, potassium hydroxide and tetraalkylammonium, and performing extraction with an organic solvent such as ethyl acetate and chloroform.

One of these basic compounds may be used alone, or two or more thereof may be used in combination.

The molecular weight of the basic compound is preferably from 250 to 1,000, more preferably from 250 to 800, still more preferably from 400 to 800.

The content of the basic compound is preferably from 1.0 to 8.0 mass %, more preferably from 1.5 to 5.0 mass %, still more preferably from 2.0 to 4.0 mass %, based on the entire solid content of the composition.

[4] Solid Content Concentration and (D) Solvent

The resist composition in the preferable embodiment of the present invention is prepared by dissolving the above-described components in a solvent.

The resist composition is stored, for example, in a refrigerated state or at room temperature and preferably causes no change in the performance during the storage period, but there is a problem that the sensitivity fluctuates after storage.

In the construction in the preferable embodiment of the present invention, it has been found that the fluctuation of sensitivity can be remarkably suppressed by adjusting the entire solid content concentration in the resist composition to be from 1.0 to 4.5 mass %.

The entire solid content concentration in the resist composition is preferably from 2.0 to 4.0 mass %, more preferably from 2.0 to 3.0 mass %.

The entire solid content corresponds to the content after removing the solvent from the composition and corresponds to the mass of the coating film after drying.

The solvent for the preparation of the resist composition is preferably an organic solvent such as ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran, more preferably cyclohexanone, γ-butyrolactone, propylene glycol monomethyl ether, propylene glycol monomethyl ether acetate or ethyl lactate, particularly preferably propylene glycol monomethyl ether.

The solvent may be one kind of a solvent alone or may be a mixed solvent obtained by mixing two or more kinds of solvents.

Out of the entire solvent amount, propylene glycol monomethyl ether is particularly preferably contained in a ratio of 50 mass % or more, most preferably from 50 to 80 mass %. The solvent used in combination with propylene glycol monomethyl ether is preferably propylene glycol monomethyl ether acetate, cyclohexanone or ethyl lactate, and most preferably propylene glycol monomethyl ether acetate.

In addition to the components described above, the resist composition of the preferable embodiment of the present invention may further contain a (E) fluorine-containing and/or silicon-containing surfactants; a dissolution inhibitor (F) having a molecular weight of 3,000 or less, which decomposes by the action of an acid to increase the dissolution rate in an alkali developer; a dye, a plasticizer, a surfactant other than the component (E), a photosensitizer, a compound capable of accelerating solubility in the developer, or the like, according to the necessity.

[8] Pattern Forming Method

The resist composition of the preferable embodiment of the present invention is coated on a support such as a semiconductor substrate to form a resist film. The thickness of the resist film is preferably from 0.02 to 0.1 μm.

The method for coating the composition on the substrate is preferably spin coating, and the rotation number at the spin coating is preferably from 1,000 to 3,000 rpm.

For example, the resist composition is coated on a substrate (e.g., silicon/silicon dioxide-coated substrate) as used in the production of a precision integrated circuit device, by an appropriate coating method such as spinner or coater, and dried to form a resist film. Incidentally, a known antireflection film may also be previously provided.

The resist film is irradiated with an electron beam, X-ray or EUV, then preferably baked (heated), and developed, whereby a good pattern can be obtained. In order to more effectively prevent damage to the resist due to the coating of the gap embedding composition, the resist film, on which a pattern has been formed, may be subjected to heat-curing treatment (post bake).

In the development step, an alkali developer is used as follows. The alkali developer which can be used for the resist composition is an alkaline aqueous solution of, for example, inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

The above-described resin sensitive to EUV exposure may be referred to Japanese Patent Application No. 2009-145677 (JP-A-2010-085971). In the present specification, when a group (group of atoms) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

<Reverse Material>

The gap embedding composition of the preferable embodiment of the present invention is preferably used as a reverse material for a patterning technique (refer to FIG. 1). A method of coating the gap embedding composition as a reverse material onto a photosensitive resin pattern is not limited in particular. Any one of appropriate methods known as a coating method may be applied. For example, methods such as a spin coat method, a dip coat method, a roller blade method, or a spray method may be applied. It is preferable to remove a solvent contained in a coated film, according to the necessity, by subjecting the coated film to a heat treatment or the like.

A coating amount may be determined so that the film thickness is preferably from 20 nm to 1,000 nm, and more preferably from 25 nm to 200 nm.

<Processing of Gap Embedding Composition>

It is preferable that the gap embedding composition is applied as a reverse material, onto a semiconductor substrate, and then a solvent is removed from the composition. In order to do that, the coated film after coating is left under the conditions of preferably from 60° C. to 200° C., and more preferably from 100° C. to 150° C., and preferably from 1 minute to 10 minutes, and more preferably from 1 minute to 5 minutes. Further, the removal of the solvent may be performed over two or more times under different conditions.

In the preferable embodiment of the present invention, the coated reverse material (the gap embedding composition) as described above is preferably heated and further cured. By doing that, the cured reverse material preferably functions as a favorable resist pattern in the subsequent etching of the semiconductor substrate (refer to FIGS. 1 (d) and (e)). The heating temperature is not limited in particular, as long as the coated film is cured. Usually, the heating temperature is preferably from 150° C. to 400° C. Especially, the heating temperature is preferably from 150° C. to 250° C., and more preferably from 125° C. to 225° C. In the case of the above-described heating conditions, the coated film may be satisfactorily cured whereby an excellent film may be formed. The heating period of time is not limited in particular but preferably from 1 minute to 60 minutes and more preferably from 1 minute to 30 minutes. The heating method is not limited in particular. The heating by a hot plate, an oven, a furnace, or the like can be applied to the heating method.

The atmosphere at the time of heating is not limited in particular. Inactive atmosphere, oxidizing atmosphere, or the like can be applied to the heating atmosphere. The inactive atmosphere can be realized with inactive gas such as nitrogen, helium, argon. The oxidizing atmosphere can be realized by a mixed gas of such inactive gas and an oxidizing gas. Alternatively, air may be used. Examples of the oxidizing gas include oxygen, carbon monoxide, and oxygen dinitride. The heating step may be performed by any one of under pressure, under ordinary pressure, under reduced pressure and in vacuum.

The reverse material pattern (cured film) (refer to reference numeral 41 of FIG. 1) obtained by the above-described heat treatment is mainly composed of an organic silicon oxide (SiOC). This enables to conduct etching of the workpiece material film with high dimensional accuracy, even if the reverse material pattern is a fine pattern of, for example, less than 40 nm, as needed. As a result, this enables to favorably address the production process of the most advanced semiconductor device.

<Ashing>

The ashing may be conducted using a known dry plasma device. Further, as a source gas at the time of dry ashing, it is possible to use an oxygen-containing gas such as $O_2$, CO and $CO_2$, an inert gas such as He, $N_2$ and Ar, a chlorine-based gas such as $Cl_2$ and $BCl_4$, $H_2$, gas of $NH_4$, or the like, though the kind of the source gas to be used depends on an elemental composition of the film to be etched. Further, these gases may be used as a mixture thereof.

EXAMPLES

The present invention will be described in more detail based on examples given below, but the invention is not meant to be limited by these.

Example 1 and Comparative Example 1

Hydrolysis condensation reaction was conducted using pheyltriethoxysilane, and methylethoxysilane, according to the necessity. The solvent used in this time was ethanol. The obtained hydrolysis condensate was contained in a coating solvent, by switching a solvent from ethanol to the other, so as to become the content of the hydrolysis condensate shown in Table 2 below, thereby preparing a gap embedding composition. A combination of solvents is shown in Table 3. The content of the aryloxysilane in the solvent was set to 5% by mass of the composition with respect to all of the samples. Further, the aryloxysilane compound was contained in the composition in the form of a hydrolysis condensate having a weight average molecular weight of approximately 5,000. The above-described weight average molecular weight was confirmed by GPC in accordance with the procedure described above.

Synthesis Example 1

Synthesis of Resin (RB-1)

p-Acetoxystyrene and (4'-hydroxyphenyl)methacrylate were charged at a ratio of 60/40 (by mol) and dissolved in tetrahydrofuran to prepare 100 mL of a solution having a solid content concentration of 20 mass %. Subsequently, 3 mol % of methyl mercaptopropionate and 4 mol % of a polymerization initiator, V-65, produced by Wako Pure Chemical Industries, Ltd. were added to the solution prepared above, and the resulting solution was added dropwise to 10 mL of tetrahydrofuran heated to 60° C., over 4 hours in a nitrogen atmosphere. After the completion of dropwise addition, the reaction solution was heated for 4 hours, and 1 mol % of V-65 was again added, followed by stirring for 4 hours. After the completion of reaction, the reaction solution was cooled to room temperature and crystallized from 3 L of hexane, and the precipitated white powder was collected by filtration.

The compositional ratio of the polymer determined from $C^{13}$-NMR was 58/42. Further, the weight average molecular weight determined by GPC was 2,200 in terms of standard polystyrene, and the dispersity (Mw/Mn) was 1.30.

The resin obtained was vacuum-dried and then dissolved in 100 mL of dehydrated THF (tetrahydrofuran), and 10 mL of cyclohexyl vinyl ether was added thereto. While stirring the resulting solution, 100 mg of p-toluenesulfonic acid was added, and the reaction was allowed to proceed for 3 hours.

The reaction solution was neutralized by adding 1 mL of triethylamine, and then, liquid separation and washing were repeated three times by adding 200 mL of ethyl acetate and further adding 500 mL of distilled water. The ethyl acetate layer was reprecipitated from hexane to obtain the objective Resin RB-1 (compositional molar ratio: 43/15/32/10) having a weight average molecular weight of 2,500 and a dispersity of 1.30. The glass transition temperature of the resin was measured by DSC and found to be 110° C.

Other resins were synthesized in the same manner.

<Preparation of Resist>

The components shown in Table 1 below were dissolved in the coating solvent shown in Table 1, and the obtained solution was filtered through a polytetrafluoroethylene filter having a pore size of 0.1 μm to prepare a positive resist solution having an entire solid content concentration (mass %) shown in Table 1. This resist solution was evaluated as follows. As for each component shown in Table 1, the solid content concentration (mass %) is on the basis of entire solid content. The amount of the surfactant added is 0.1 mass % based on the entire solid content of the resist composition. The solid content concentration of the resin is an amount obtained by removing the photoacid generator, basic compound and surfactant from the amount of all solid contents in the resist composition.

[Acid-Decomposable Resin]

The structure, molecular weight and dispersity of each of the acid-decomposable resins used in Examples are shown below.

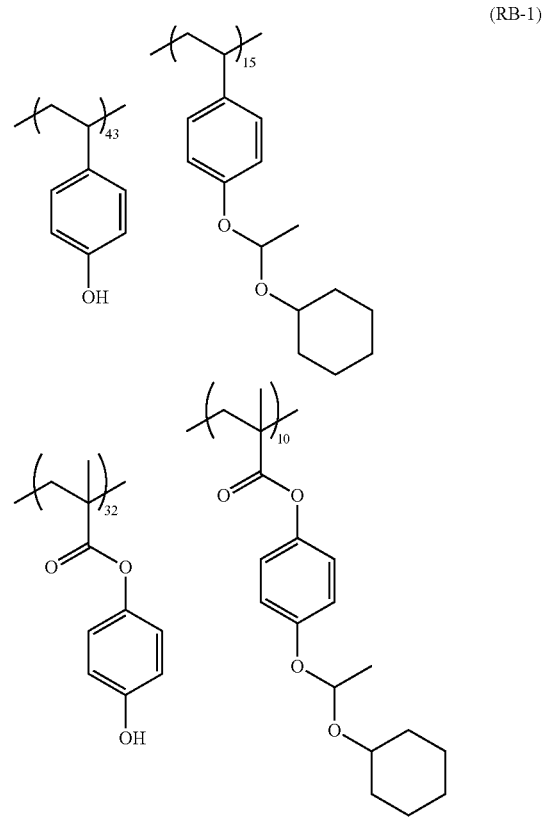

Mw 2500 Mw/Mn 1.30

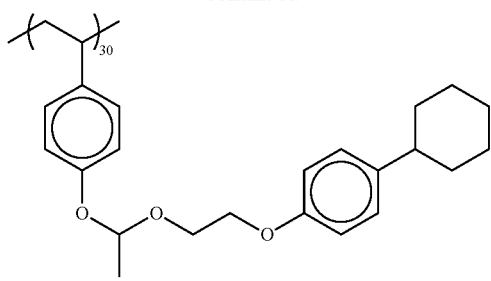
Mw 1500
Mw/Mn 1.4
(RB-3)
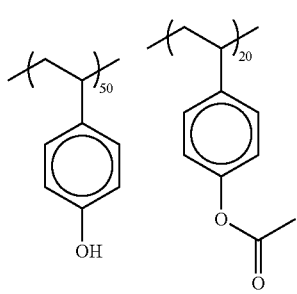
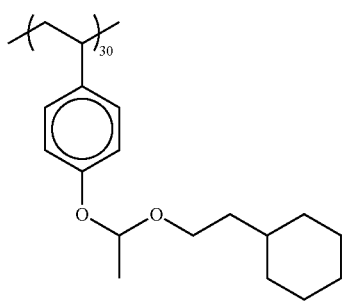
Mw 2000
Mw/Mn 1.4
(RB-4)
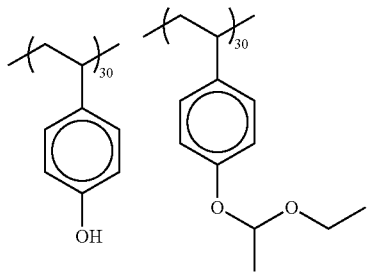
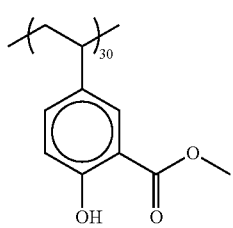
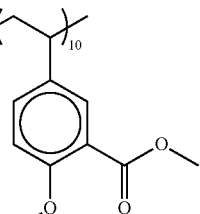
Mw 2500
Mw/Mn 1.4
(RB-5)
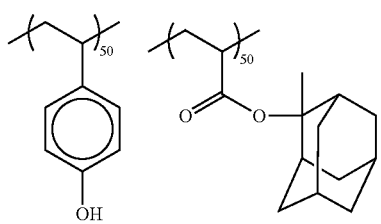
Mw 2500
Mw/Mn 1.4
(RB-6)
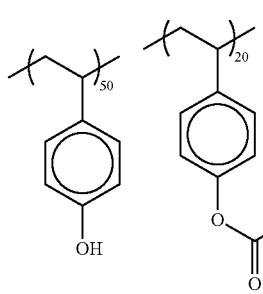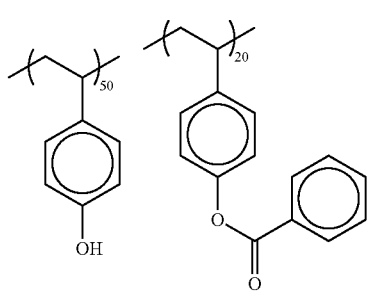
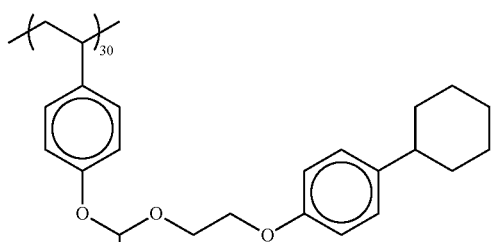
Mw 1500
Mw/Mn 1.4
(RB-7)
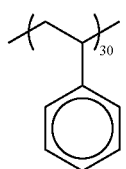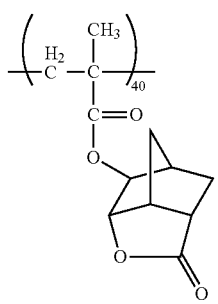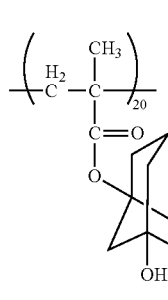

-continued

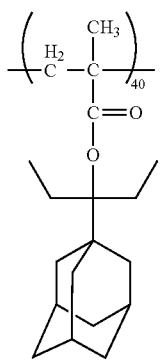

Mw 2500
Mw/Mn 1.4

(RB-8)

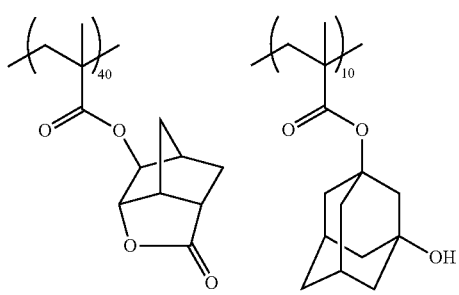

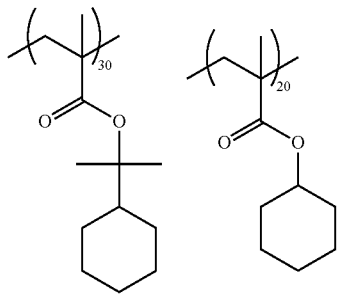

Mw 2500
Mw/Mn 1.4

[Acid Generator]
The acid generators shown in Table 1 correspond to those illustrated above.
[Basic Compound]

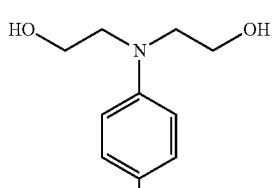

Mw: 195

-continued

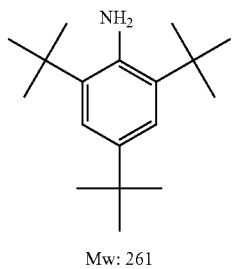

Mw: 261

A-2

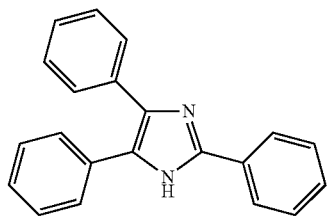

Mw: 296

A-3

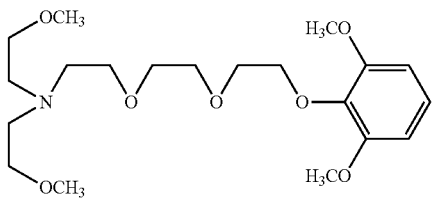

Mw: 401

A-4

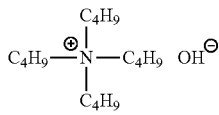

Mw: 259

A-5

[Surfactant]
W-1: Megaface F-176 (produced by Dainippon Ink & Chemicals, Inc.) (fluorine-containing surfactant)

W-2: Megaface R08 (produced by Dainippon Ink & Chemicals, Inc.) (fluorine- and silicon-containing surfactant)

W-3: Polysiloxane Polymer KP-341 (produced by Shin-Etsu Chemical Co., Ltd.) (silicon-containing surfactant)

[Solvent]
A1: Propylene glycol monomethyl ether acetate
B1: Propylene glycol monomethyl ether

TABLE 1

| Resist Sample No. | Acid Generator* | Resin | Basic Compound* | Surfactant | Entire Solid Content Concentration | Solvent** (mass ratio) |
|---|---|---|---|---|---|---|
| R1 | Z-4 (11) | RB-2 | A-3 (2.6) | W-1 | 3.0 | 40/60 |
| R2 | Z-66 (28) | RB-3 | A-3 (2.2) | W-1 | 2.5 | 40/60 |

TABLE 1-continued

| Resist Sample No. | Acid Generator* | Resin | Basic Compound* | Surfactant | Entire Solid Content Concentration | Solvent** (mass ratio) |
|---|---|---|---|---|---|---|
| R3 | Z-69 (30) | RB-1 | A-5 (1.9) | W-1 | 2.5 | 40/60 |
| R4 | Z-69 (37) | RB-8 | A-4 (4.2) | W-1 | 2.5 | 40/60 |
| R5 | Z-67 (37) | RB-5 | A-4 (4.2) | W-1 | 2.5 | 40/60 |
| R6 | Z-67 (37) | RB-6 | A-4 (4.2) | W-1 | 2.5 | 40/60 |
| R7 | Z-67 (37) | RB-4 | A-4 (4.2) | W-1 | 2.5 | 40/60 |
| R8 | Z-12 (23) | RB-4 | A-2 (2.3) | W-1 | 2.5 | 40/60 |
| R9 | Z-38 (31) | RB-5 | A-3 (2.4) | W-2 | 2.5 | 40/60 |
| R10 | Z-66 (28) | RB-3 | A-1 (4.0) | W-2 | 2.5 | 40/60 |

*The numbers in parenthesis are content percentages: Concentration in Solid content
**mass ratio: A1/B1

A workpiece material film of $SiO_2$ with the thickness of 100 nm was formed on a silicon wafer, by a spin coater. A resist pattern having a width (corresponding to the width v of FIG. 1) of the wall portion of the resist pattern was approximately 22 nm was produced by providing the above-described EUV-sensitive resist material on the workpiece material film, so as to set the values of gap width and aspect ratio to be those in the following Table 3, respectively. Specifically, the resist pattern was formed such that a lot of linear trenches were stretched in a planar view. In that time, electron beam irradiated was EUV (manufactured by Lintec Corporation, wavelength of 13 mm). The dimensions such as these width and depth were measured by cutting a specimen in a necessary section, and then observing the section by a scanning electron microscope.

With respect to each specimen of the substrate to which the embedding composition (Table 2) thus obtained was applied, evaluation was conducted in terms of the following items.

[Coating Property]

Each of the specimens (before a heating treatment) of the substrates, on which each of the embedding compositions was coated, was observed by an optical microscope. The results were judged in accordance with the following classified levels.
AA: There is no unevenness.
A: There is some unevenness, which is an acceptable level.
B: There is a conspicuous unevenness.
C: There is the occurrence of cissing beyond the degree of unevenness.

[Property of Damage to Resist Film]

Evaluation of the property of damage to a resist film was conducted in terms of a residual film rate in the case of immersing the resist film in a coating solvent (Table 1) for 1 minute. The results were judged in accordance with the following classified levels.
AA: Residual film rate was 95% or more.
A: Residual film rate was less than 95% and 90% or more.
B: Residual film rate was less than 90% and 85% or more.
C: Residual film rate was less than 85% and 70% or more.
D: Residual film rate was less than 70%.

The rank "B" or more in accordance with the above evaluation is desirable in an ordinary use. However, even the rank "C" is conformable under the particular conditions of use. The rank "D" does not meet a required performance for production of the semiconductor device.

[Embedding Property]

Each of the samples (after a heat treatment) of the semiconductor substrates provided with each of the embedding compositions was cut such that a section of each trench was exposed. Each of the sections was observed by a scanning electron microscope (SEM). The results were evaluated in accordance with the following classified levels.

AA: There was no void.
A: A void with a diameter of less than 5 nm was confirmed.
B: A void with a diameter from 5 nm to less than 10 nm was confirmed.
C: There was a void with a diameter of 10 nm or more.

[Planarization]

Figure 2:
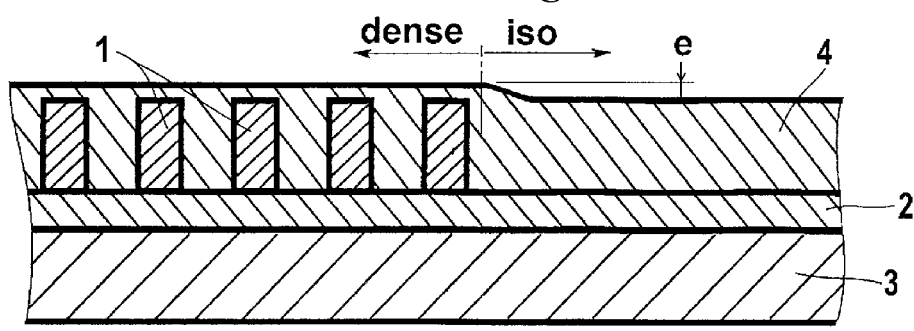
FIG. 2 is an example of a cross-sectional view schematically showing the state of a composition for use in embedding a trench in the vicinity of termination of a photosensitive resin pattern.

Each of the samples (after a heat treatment) of the semiconductor substrates provided, to which each of the embedding compositions was applied, was cut such that a section of each trench was exposed at the periphery of the rough (iso)/tight (dense) portion of the resist pattern. Each of the sections was observed by a scanning electron microscope (SEM). The results were evaluated in accordance with the following classified levels. FIG. 2 is a view schematically showing the state at the periphery of the iso/dense portion. The smaller the film thickness difference (e) between the iso portion and the dense portion is, the better it is.
AA: Film thickness difference (e) was 5 nm or less.
A: Film thickness difference (e) was more than 5 nm and 10 nm or less.
B: Film thickness difference (e) was more than 10 nm and 15 nm or less.
C: Film thickness difference (e) was more than 15 nm.

[Ashing Selection Ratio]

Measurement of the ashing selection ratio with respect to the resist film was conducted. The results are shown in Table 3.

The ashing treatment was conducted under the following conditions.

The ashing treatment was carried out for 22 seconds using a dry etching device (U-621 [trade name], manufactured by Hitachi High-Technologies Corporation) under the condition: RF power: 600 W; antenna bias: 100 W; wafer bias: 0 W; inner pressure of chamber: 1.0 Pa; substrate temperature: 20° C.; and the kind of mixed gas and flow rate: $O_2$: 25 mL/min. and Ar: 500 mL/min.

TABLE 2

| Composition | MTES mass % | PhTES mass % | PhTES Weight average molecular weight |
|---|---|---|---|
| 1-1 | 0 | 100 | 3,000 |
| 1-2 | 0 | 100 | 5,000 |
| 1-3 | 0 | 100 | 10,000 |
| 1-4 | 0 | 100 | 20,000 |
| 1-5 | 0 | 100 | 50,000 |
| c1 | 100 | 0 | — |
| 2-1 | 25 | 75 | 5,000 |

PhTES: phenyltriethoxysilane
MTES: mehyltriethoxysilane

TABLE 3

| Sample No. | EUV resist | Gap embedding composition Composition | Gap embedding composition Coating solvent | Coating property | Resist damaging property | Embedding property Width - AR | Embedding property Planarization | Ashing selection ratio |
|---|---|---|---|---|---|---|---|---|
| 101 | R2 | 1-1 | Mesitylene | AA | AA | 22-2 | AA | A | 11 |
| 102 |  | 1-2 | Xylene | AA | A | ↑ | AA | AA | 12 |
| 103 |  | 1-2 | Mesitylene | AA | AA | ↑ | AA | AA | 14 |
| 104 |  | 1-2 | Cumene | AA | AA | ↑ | AA | AA | 16 |
| 105 |  | 1-3 | Mesitylene | AA | AA | ↑ | AA | AA | 15 |
| 106 |  | 1-3 | Toluene | AA | A | ↑ | AA | A | 9 |
| 107 |  | 1-3 | Cumene | AA | AA | ↑ | AA | AA | 12 |
| 108 |  | 1-4 | Cumene | AA | AA | ↑ | AA | A | 9 |
| 109 |  | 1-5 | Mesitylene | AA | AA | ↑ | A | A | 10 |
| 110 |  | 2-1 | Mesitylene | A | AA | ↑ | A | A | 8 |
| c11 |  | 1-1 | PGMEA | AA | D | ↑ | — | — | — |
| c12 |  | 1-2 | MIBC | C | — | ↑ | — | — | — |
| c13 |  | c1 | Mesitylene | C | — | ↑ | — | — | — |
| 111 | R3 | 1-2 | Mesitylene | AA | A | ↑ | AA | AA | 10 |

PGMEA: plopylene glycol monometyl ether acetate
MIBC: methylisobutyl carbinol
Width-AR: width (nm) and aspect ratio (depth/width) of gap It is seen from the above-described results that even in the case where the EUV-sensitive resist was used, when the embedding composition of the present invention was used as a composition for use in embedding a gap of the resist pattern of the EUV-sensitive resist, the composition of the present invention enables to realize excellent properties in terms of gap embedding property, coating property, planarization, and suppression of damaging property of a photosensitive resin pattern as well as high ashing selection ratio.

Example 2 and Comparative example 2

In the same manner as in the example 1, a reverse process test in which an embedding composition was applied was also conducted with respect to EUV resists R1, R4 to R10. The followings were also confirmed with respect to these EUV resists. That is, the embedding composition and the embedding method of the present invention make it possible to exhibit excellent properties in terms of gap embedding property, coating property, planarization, and the suppression of damaging property of photosensitive resin pattern as well as high ashing selection ratio.

Reference Comparative Example

A resin composition was prepared as described below in accordance with Example 1 of JP-A-2008-287176. 0.42 g of maleic acid anhydride was dissolved by heating in 18.2 g of water to prepare a maleic acid aqueous solution. Then, 30.5 g of methyltriethoxysilane and 50.8 g of 4-methyl-2-pentanol were placed in a flask. The flask was set with a condenser tube and a dripping funnel which contained the preliminarily prepared maleic acid aqueous solution, and then heated at 100° C. on an oil bath. Then, the maleic acid aqueous solution was slowly dropped to allow it to react with the components in the flask at 100° C. for 4 hours. After the end of reaction, the flask containing therein the reaction solution was left for cooling. Then, the flask was set in an evaporator and ethanol produced during the reaction was removed by the evaporator to obtain the reaction product (polysiloxane: weight average molecular weight of 1,400). Thereafter, 26.7 g of the thus-obtained polysiloxane was dissolved in 26.7 g of an organic solvent (4-methyl-2-pentanol). Then, the resultant solution was filtrated with a filter having a pore size of 0.2 μm to obtain a resin composition for pattern conversion of Example 1 (s1).

Evaluation was conducted using the composition sample s1 in the same terms as those described above. The evaluation revealed the following results. In the reference comparative example, the "Width-AR" was 22-2.
Resist damaging property: D
Embedding property: —
Planarization: —
Ashing selection ratio: —

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1: photosensitive resin film portions (photosensitive resin pattern, resist pattern)
2: workpiece material
3: silicon wafer
4: reverse material
41: reverse material pattern

The invention claimed is:
1. A gap embedding composition used for embedding a patterned gap formed between photosensitive resin film portions on a semiconductor substrate surface, the gap embedding composition, at least comprising:
a hydrolysis condensate of an aryloxysilane raw material; and
an aromatic compound, as a solvent,
wherein the solvent is a compound selected from the group consisting of mesitylene, cumene, xylene, toluene and benzene, and
wherein the aryloxysilane is an organic silicon compound represented by formula (A):

$$R^1Si(OR^2)_3 \qquad (A)$$

wherein $R^1$ represents a phenyl group and $R^2$ represents a straight chain or branched alkyl group having 1 to 20 carbon atoms.
2. The composition according to claim 1, wherein the hydrolysis condensate is poly(phenylsiloxane).
3. The composition according to claim 1, wherein the hydrolysis condensate has an average molecular weight of 1,000 to 50,000.

4. The composition according to claim 1, wherein a solvent for dissolving the aryloxysilane raw material used for the above-described hydrolysis and condensation is different from the solvent for incorporating the hydrolysis condensate therein.

5. The composition according to claim 1, wherein a content of the hydrolysis condensate is more than 2.5% by mass and 15% by mass or less of the gap embedding composition.

6. A method of embedding a gap, comprising the steps of:
preparing a patterned gap formed between photosensitive resin film portions on a semiconductor substrate surface; and
dispensing the composition according to claim 1 to the patterned gap so as to embed the patterned gap with the composition,
wherein the photosensitive resin is sensitive to EUV exposure.

7. The method according to claim 6, wherein the photosensitive resin is a resin having one or both of a repeating unit represented by formula (II) and a repeating unit represented by formula (III):

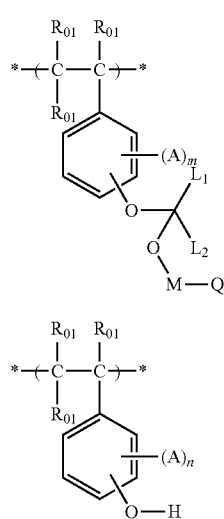

wherein in formulae (II) and (III), each $R_{01}$ independently represents a hydrogen atom, an alkyl group, a cycloalkyl group, a halogen atom, a cyano group or an alkoxycarbonyl group,
each of $L_1$ and $L_2$, which may be the same or different, represents a hydrogen atom, an alkyl group, a cycloalkyl group or an aralkyl group,
M represents a single bond or a divalent linking group,
Q represents an alkyl group, a cycloalkyl group, an aryloxy group or an alicyclic or aromatic ring group which may contain a heteroatom,
at least two members out of Q, M and $L_1$ may combine to form a 5- or 6-membered ring,
each A independently represents a halogen atom, a cyano group, an acyl group, an alkyl group, an alkoxy group, an acyloxy group or an alkoxycarbonyl group, and
each of m and n independently represents an integer of 0 to 4.

8. A method of producing a semiconductor device, comprising the steps of:

preparing a patterned gap formed between photosensitive resin film portions on a semiconductor substrate surface;
dispensing the composition according to claim 1 to the patterned gap so as to embed the patterned gap with the composition;
curing the composition containing the hydrolysis condensate;
removing the photosensitive resin film portions; and then
etching the semiconductor substrate other than the portion of cured composition having been left in the former patterned gap,
wherein the photosensitive resin is sensitive to EUV exposure, and
said method further comprising the step of heating and curing the photosensitive resin film portions before dispensing the embedding composition to the patterned gap.

9. The method according to claim 8, wherein the photosensitive resin is a resin having one or both of a repeating unit represented by formula (II) and a repeating unit represented by formula (III):

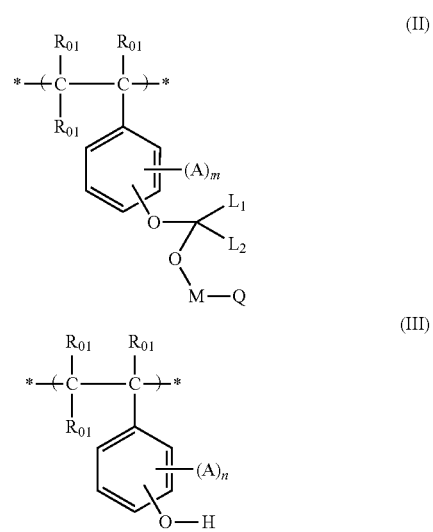

wherein in formulae (II) and (III), each $R_{01}$ independently represents a hydrogen atom, an alkyl group, a cycloalkyl group, a halogen atom, a cyano group or an alkoxycarbonyl group,
each of $L_1$ and $L_2$, which may be the same or different, represents a hydrogen atom, an alkyl group, a cycloalkyl group or an aralkyl group,
M represents a single bond or a divalent linking group,
Q represents an alkyl group, a cycloalkyl group, an aryloxy group or an alicyclic or aromatic ring group which may contain a heteroatom,
at least two members out of Q, M and $L_1$ may combine to form a 5- or 6-membered ring,
each A independently represents a halogen atom, a cyano group, an acyl group, an alkyl group, an alkoxy group, an acyloxy group or an alkoxycarbonyl group, and
each of m and n independently represents an integer of 0 to 4.

* * * * *